(12) United States Patent
Kwon et al.

(10) Patent No.: US 11,874,485 B2
(45) Date of Patent: Jan. 16, 2024

(54) AUGMENTED REALITY PROVIDING DEVICE

(71) Applicant: Samsung Display Co., Ltd., Yongin-si (KR)

(72) Inventors: Jaejoong Kwon, Suwon-si (KR); Juhwa Ha, Seoul (KR); JeongWoo Park, Yongin-si (KR); Subin Jung, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 467 days.

(21) Appl. No.: 16/731,632

(22) Filed: Dec. 31, 2019

(65) Prior Publication Data

US 2020/0209453 A1 Jul. 2, 2020

(30) Foreign Application Priority Data

Jan. 2, 2019 (KR) .................. 10-2019-0000423

(51) Int. Cl.
| | |
|---|---|
| *G02B 5/30* | (2006.01) |
| *H10K 50/86* | (2023.01) |
| *H10K 50/858* | (2023.01) |
| *H10K 59/12* | (2023.01) |

(52) U.S. Cl.
CPC ......... *G02B 5/3083* (2013.01); *G02B 5/3025* (2013.01); *H10K 50/858* (2023.02); *H10K 50/86* (2023.02); *H10K 59/12* (2023.02)

(58) Field of Classification Search
None
See application file for complete search history.

(56) References Cited

U.S. PATENT DOCUMENTS

| | | | |
|---|---|---|---|
| 8,482,584 B2 | 7/2013 | Nam | |
| 9,419,065 B2 * | 8/2016 | Degner | ............... H01L 27/3276 |
| 9,761,051 B2 | 9/2017 | Bromer | |
| 2010/0149073 A1 * | 6/2010 | Chaum | ............. G02B 27/0075 |
| | | | 345/8 |
| 2011/0249087 A1 * | 10/2011 | Tsang | .................. G03H 1/2294 |
| | | | 348/40 |
| 2018/0039052 A1 * | 2/2018 | Khan | ................. G02B 17/0856 |
| 2018/0063520 A1 * | 3/2018 | Chung | ................. H04N 13/346 |
| 2019/0086668 A1 | 3/2019 | Ha | |
| 2020/0026084 A1 | 1/2020 | Kwon et al. | |

FOREIGN PATENT DOCUMENTS

| | | |
|---|---|---|
| KR | 10-2011-0139549 A | 12/2011 |
| KR | 10-2014-0133323 A | 11/2014 |
| KR | 10-1660519 B1 | 9/2016 |
| KR | 10-1830364 B1 | 2/2018 |
| KR | 10-2020-0010695 A | 1/2020 |

* cited by examiner

*Primary Examiner* — Anthony J Frost
(74) *Attorney, Agent, or Firm* — Lewis Roca Rothgerber Christie LLP

(57) ABSTRACT

An augmented reality providing device includes a lens including a reflective mirror, a display module on at least one side surface of the lens and configured to display an image, and an anti-reflective module between the display module and the lens.

24 Claims, 23 Drawing Sheets

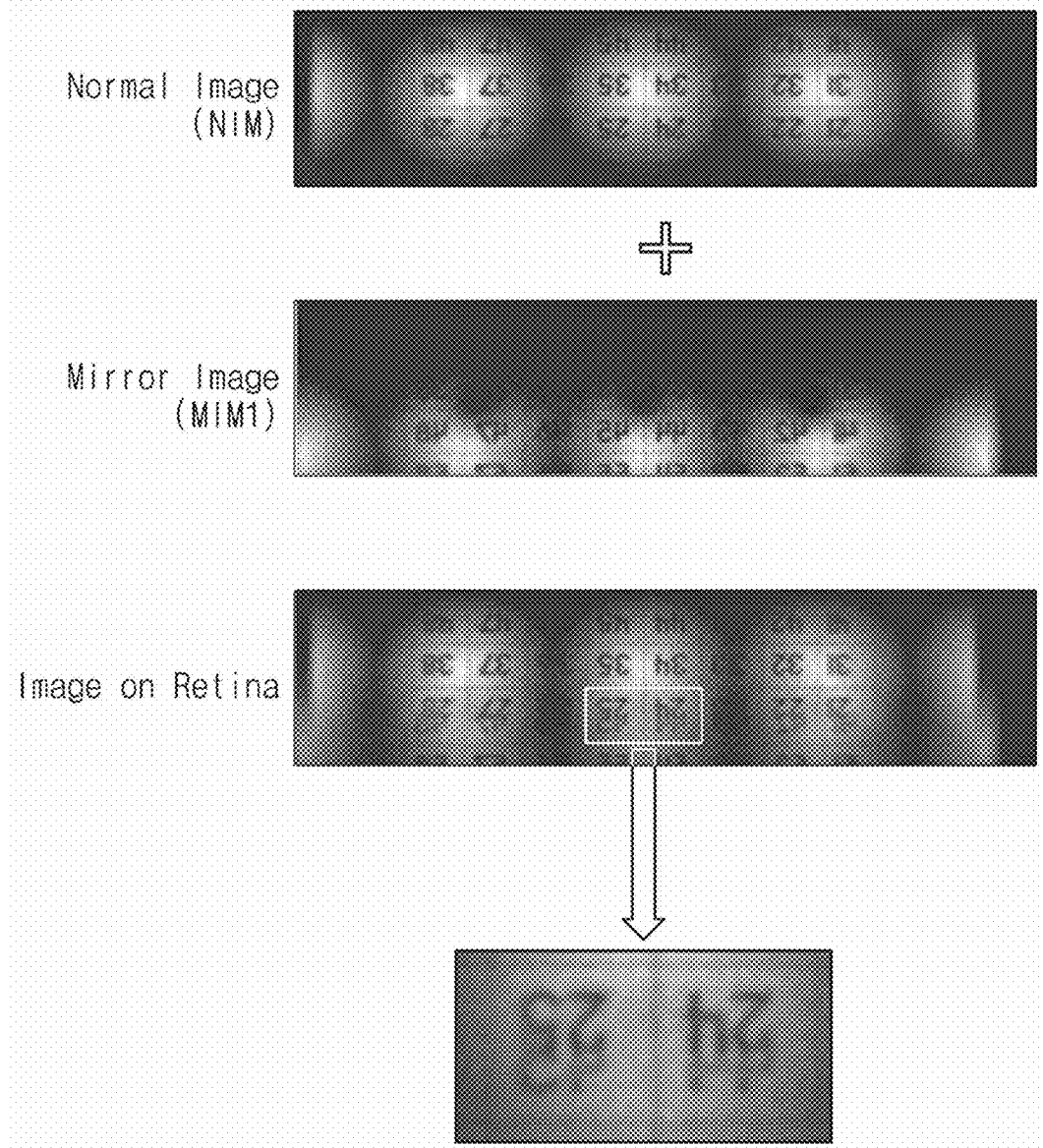

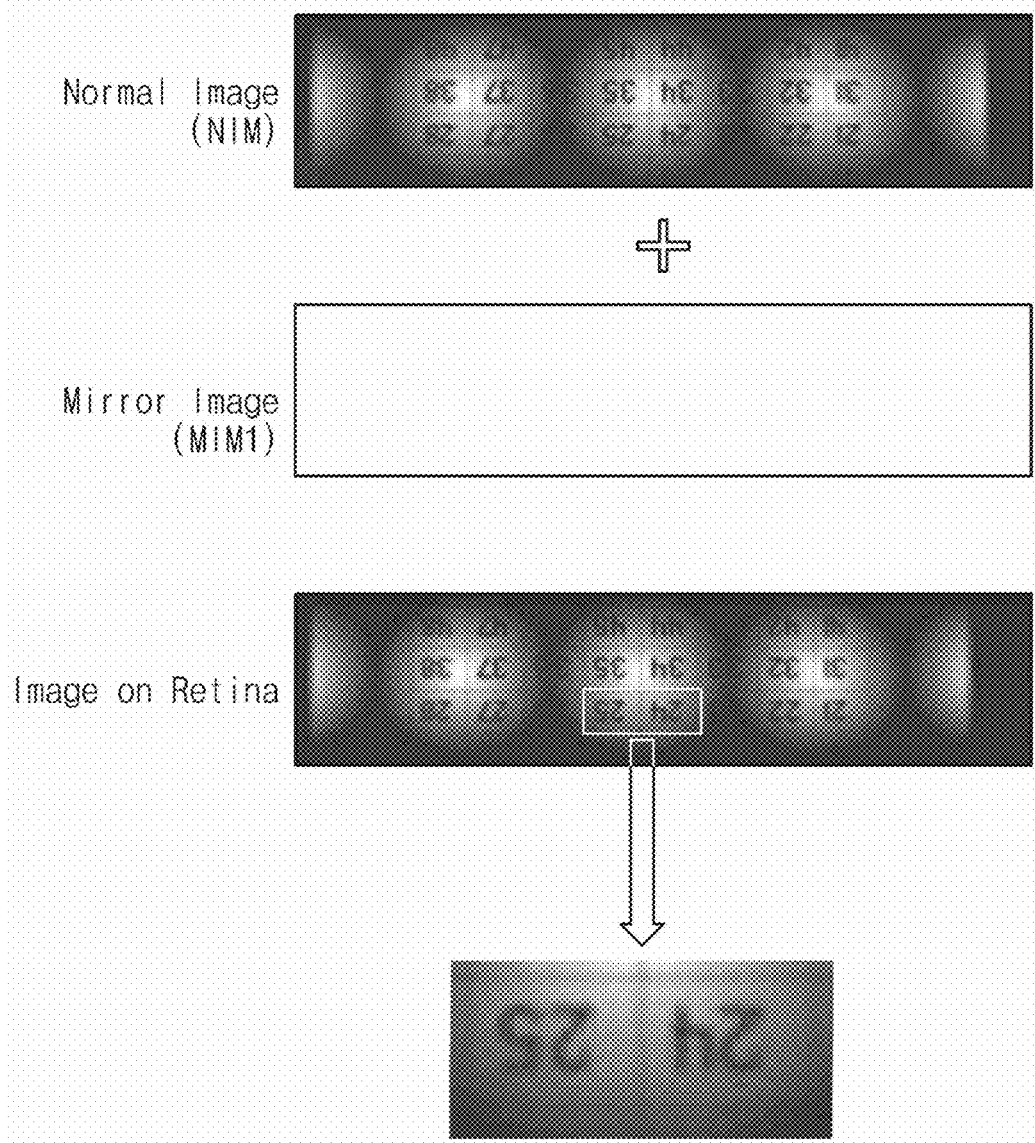

ND DEVICE

CROSS-REFERENCE TO RELATED APPLICATION

This application claims priority to and the benefit of Korean Patent Application No. 10-2019-0000423, filed on Jan. 2, 2019, the content of which is hereby incorporated by reference in its entirety.

BACKGROUND

1. Field

Aspects of the present disclosure relate to an augmented reality providing device.

2. Description of the Related Art

Augmented reality refers to the technology of superimposing a virtual image on a user's view of the real world image and displaying the superimposed image as a single image. The virtual image is an image in the form of text or graphics, and the real image is information on real objects observed in the field of view of the device.

The augmented reality is implemented by a head mounted display (HMD) or a heads-up display (HUD). When the augmented reality is implemented by the HMD, the HMD may be provided in the form of a pair of glasses so that a user may easily wear it or takes it off as well as carries it.

An augmented reality providing device includes a display device to provide the virtual image used to implement the augmented reality. In recent years, there has been a demand to enlarge an area of the display device that is seen by the user, that is, a field of view (FOV) of the user.

SUMMARY

Aspects of the present disclosure are directed to an augmented reality providing device capable of providing a clear image.

According to some embodiments of the inventive concept, there is provided an augmented reality providing device including: a lens including a reflective mirror; a display module on at least one side surface of the lens and configured to display an image; and an anti-reflective module between the display module and the lens.

In some embodiments, the display module includes: a first display part on a first side surface of the lens; a second display part on a second side surface of the lens; a third display part on a third side surface of the lens; and a fourth display part on a fourth side surface of the lens.

In some embodiments, the anti-reflective module includes: a linear polarization film on at least a side surface of the lens; and a retardation film between the linear polarization film and the display module.

In some embodiments, the linear polarization film includes first, second, third, and fourth polarization parts respectively corresponding to the first, second, third, and fourth side surfaces of the lens, and the retardation film includes first, second, third, and fourth retardation parts respectively corresponding to the first, second, third, and fourth polarization parts.

In some embodiments, the first, second, third, and fourth polarization parts are respectively closer to the first, second, third, and fourth side surfaces of the lens more than the first, second, third, and fourth retardation parts, and the first, second, third, and fourth retardation parts are between the first, second, third, and fourth polarization parts and the first, second, third, and fourth display parts, respectively.

In some embodiments, the first and third polarization parts face each other, the second and fourth polarization parts face each other, the first and third polarization parts have polarization axes substantially parallel to each other, and the second and fourth polarization parts have polarization axes substantially parallel to each other.

In some embodiments, the first, second, third, and fourth polarization parts have polarization axes substantially parallel to each other.

In some embodiments, the retardation film is a quarter wavelength ($\lambda/4$) retardation film.

In some embodiments, the anti-reflective module includes: a first anti-reflective module between the first and second side surfaces of the lens and the first and second display parts; and a second anti-reflective module between the third and fourth side surfaces of the lens and the third and fourth display parts.

In some embodiments, the first anti-reflective module includes: a first linear polarization film including first and second polarization parts respectively corresponding to the first and second side surfaces of the lens; and a first retardation film including first and second retardation parts between the first and second display parts and the first and second polarization parts, respectively, and wherein the second anti-reflective module includes: a second linear polarization film including third and fourth polarization parts respectively corresponding to the third and fourth side surfaces of the lens; and a second retardation film including third and fourth retardation parts between the third and fourth display parts and the third and fourth polarization parts, respectively.

In some embodiments, the first and third polarization parts face each other, the second and fourth polarization parts face each other, the first and third polarization parts have polarization axes substantially perpendicular to each other, and the second and fourth polarization parts have polarization axes substantially perpendicular to each other.

In some embodiments, the first and second polarization parts have polarization axes substantially parallel to each other, and the third and fourth polarization parts have polarization axes substantially parallel to each other.

In some embodiments, each of the first and second retardation films is a quarter wavelength ($\lambda/4$) retardation film.

In some embodiments, the anti-reflective module includes: a first anti-reflective module between the first side surface of the lens and the first display part; a second anti-reflective module between the second side surface of the lens and the second display part; a third anti-reflective module between the third side surface of the lens and the third display part; and a fourth anti-reflective module between the fourth side surface of the lens and the fourth display part.

In some embodiments, the reflective mirror includes: a first reflective mirror configured to reflect a first image displayed through the first display part toward an exiting surface of the lens; a second reflective mirror configured to reflect a second image displayed through the second display part toward the exiting surface of the lens; a third reflective mirror configured to reflect a third image displayed through the third display part toward the exiting surface of the lens;

and a fourth reflective mirror configured to reflect a fourth image displayed through the fourth display part toward the exiting surface of the lens.

In some embodiments, each of the first, second, third, and fourth reflective mirrors includes a plurality of reflective mirrors.

In some embodiments, the display module is on a first side surface of the lens.

In some embodiments, the anti-reflective module is between the display module and the first side surface.

In some embodiments, the anti-reflective module extends to cover all side surfaces of the lens except for the first side surface of the lens.

In some embodiments, the display module includes an organic light emitting display device.

In some embodiments, the display module includes a flexible display module.

According to some embodiments of the inventive concept, there is provided an augmented reality providing device including: a lens including a first reflective mirror and a second reflective mirror; a first display module on a first side surface of the lens to display an image; a second display module on a second side surface of the lens to display an image; a first anti-reflective module between the second display module and the lens; and a second anti-reflective module between the first display module and the lens.

In some embodiments, the first anti-reflective module includes: a first linear polarization film on the first side surface; and a first retardation film on the first linear polarization film, and the second anti-reflective module includes: a second linear polarization film on the second side surface; and a second retardation film on the second linear polarization film.

In some embodiments, a polarization axis of the first linear polarization film is substantially perpendicular to a polarization axis of the second linear polarization film.

According to the above, the augmented reality providing device includes the anti-reflective module disposed between the lens and the display module. In this way, the overlay of a plural images on each other may be prevented, and as a result, a user may be provided with a clear image.

BRIEF DESCRIPTION OF THE DRAWINGS

The above and other features of the present disclosure will become readily apparent by reference to the following detailed description when considered in conjunction with the accompanying drawings wherein:

FIG. 7B is a view showing an image perceived by the user through the conventional augmented reality providing device;

FIG. 8B is a view showing an image perceived by the user through the augmented reality providing device according to an exemplary embodiment of the present disclosure;

DETAILED DESCRIPTION

Figure 1:
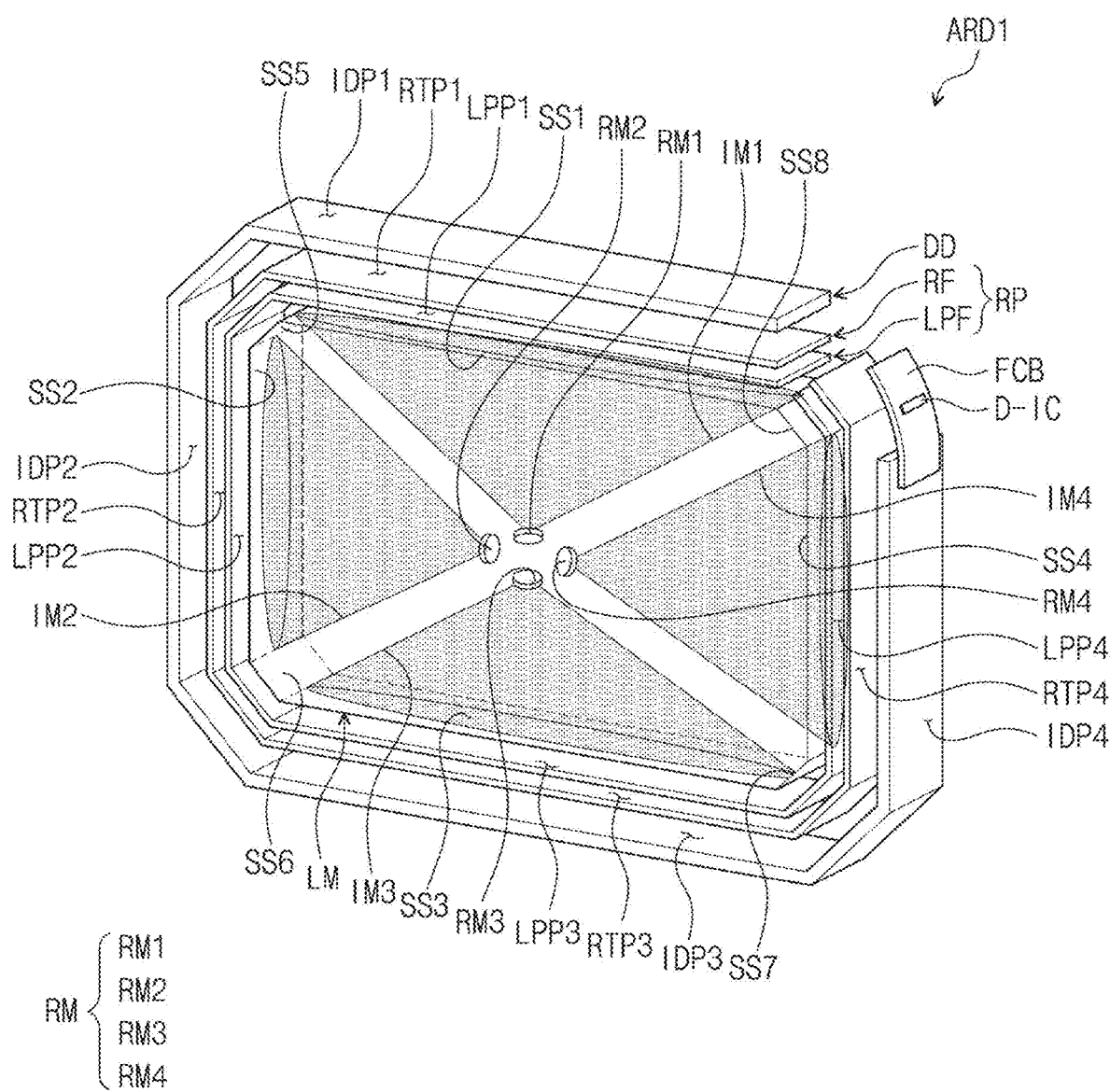
FIG. 1 is an exploded perspective view showing an augmented reality providing device according to an exemplary embodiment of the present disclosure.

Like numerals refer to like elements throughout. In the drawings, the thickness, ratio, and dimension of components are exaggerated for effective description of the technical content.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 2:
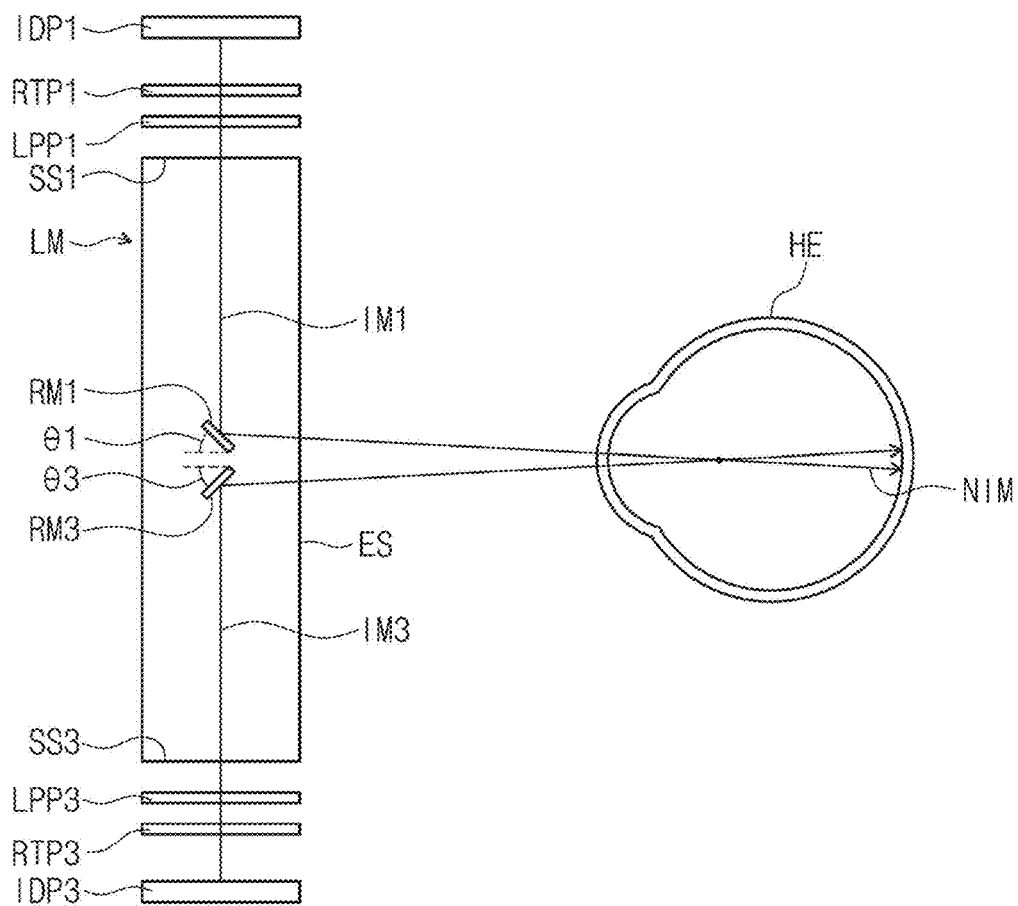
FIG. 2 is a cross-sectional view showing an operation of the augmented reality providing device shown in FIG. 1.
Figure 3:
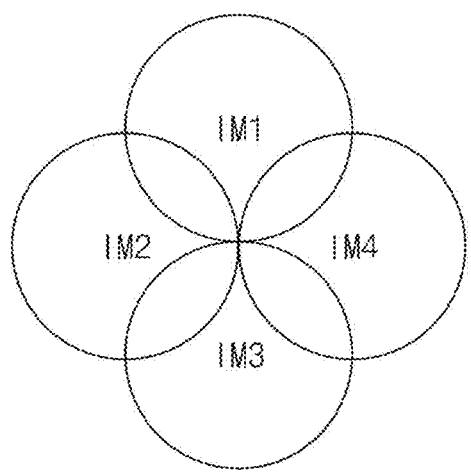
FIG. 3 is a view showing an image provided to a user by the augmented reality providing device shown in FIG. 1.

FIG. 1 is an exploded perspective view showing an augmented reality providing device ARD1 according to an exemplary embodiment of the present disclosure. FIG. 2 is a cross-sectional view showing an operation of the augmented reality providing device ARD1 shown in FIG. 1. FIG. 3 is a view showing an image provided to a user by the augmented reality providing device ARD1 shown in FIG. 1.

Referring to FIGS. 1 and 2, the augmented reality providing device ARD1 according to the exemplary embodiment of the present disclosure includes a lens LM, a display module DD, and an anti-reflective module RP.

The lens LM may be formed of a glass or plastic material to be transparent or semi-transparent. Accordingly, a user may see a real image through the lens LM. The lens LM may have a set or predetermined refractive index by taking into account a user's sight.

The lens LM may have a decahedron shape defined by two bottom faces SF1 and SF2 and eight side faces SIF1 to SIF8 connecting the two bottom faces, however, the shape of the lens LM should not be limited thereto or thereby. That is, the lens LM may have various other suitable shapes. For example, the lens LM may have a polyhedron shape defined by two bottom faces and side faces connecting the two bottom faces, each of which has a polygonal shape. In addition, the lens LM may have other suitable shapes, such as a cylindrical shape, an elliptical-cylindrical shape, a semi-cylindrical shape, or a semi-elliptical cylindrical shape, rather than the polygonal shape.

The lens LM includes first, second, third, and fourth reflective mirrors RM1, RM2, RM3, and RM4. The reflective mirror RM may be called a pin mirror. The first to fourth reflective mirrors RM1 to RM4 may include a metal material having a high reflectance, such as silver (Ag).

In FIG. 1, the lens LM includes four reflective mirrors RM1, RM2, RM3, and RM4, but the number of the reflective mirrors RM should not be limited to four. That is, the lens LM may include a plurality of first reflective mirrors RM1, a plurality of second reflective mirrors RM2, a plurality of third reflective mirrors RM3, and a plurality of fourth reflective mirrors RM4. The lens LM may include the first reflective mirrors RM1, the second reflective mirrors RM2, the third reflective mirrors RM3, and the fourth reflective mirrors RM4 to widen an area of the display module DD visible to a user's eye HE, that is, a field of view (FOV) of the user.

The display module DD displays a virtual image to implement an augmented reality. The display module DD may be disposed on side surfaces of the lens LM. The display module DD may include first, second, third, and fourth display parts IDP1, IDP2, IDP3, and IDP4. The first display part IDP1 displays a first image IM1, the second display part IDP2 displays a second image IM2, the third display part IDP3 displays a third image IM3, and the fourth display part IDP4 displays a fourth image IM4.

The display module DD may be flexible, and thus may be bent. As an example, the display module DD may be an organic light emitting display.

FIGS. 1 and 2 show a structure in which the display module DD is disposed on the side surfaces of the lens LM; however, the present disclosure should not be limited thereto or thereby. That is, the display module DD may be disposed on one side surface of the lens LM. In this case, the display module DD may include one display part displaying the image.

The first display part IDP1 is disposed on a first side surface SS1 of the lens LM, the second display part IDP2 is disposed on a second side surface SS2 of the lens LM, the third display part IDP3 is disposed on a third side surface SS3 of the lens LM, and the fourth display part IDP4 is disposed on a fourth side surface SS4 of the lens LM. The second display part IDP2 extends from one end of the first display part IDP1 and is bent to the second side surface SS2. The lens LM may further include a fifth side surface SS5 between the first side surface SS1 and the second side surface SS2, and the bent area between the first display part IDP1 and the second display part IDP2 may be disposed on the fifth side surface SS5 of the lens LM.

The third display part IDP3 extends from one end of the second display part IDP2 and is bent. The lens LM may further include a sixth side surface SS6 between the second side surface SS2 and the third side surface SS3, and the bent area between the second display part IDP2 and the third display part IDP3 may be disposed on the sixth side surface SS6 of the lens LM. The fourth display part IDP4 extends from one end of the third display part IDP3 and is bent. The lens LM may further include a seventh side surface SS7 between the third side surface SS3 and the fourth side surface SS4, and the bent area between the third display part IDP3 and the fourth display part IDP4 may be disposed on the seventh side surface SS7 of the lens LM. That is, the display module DD may be disposed to surround the side surfaces of the lens LM.

The anti-reflective module RP may be disposed between the display module DD and the lens LM. The anti-reflective module RP may include a linear polarization film LPF and a retardation film RF. The linear polarization film LPF is disposed closer to the side surface of the lens LM than the retardation film RF. That is, the linear polarization film LPF is disposed between the retardation film RF and the lens LM.

The linear polarization film LPF may include a polyvinyl alcohol (PVA). The linear polarization film LPF has a polarization axis, passes light components matching the polarization axis, and absorbs light components that do not match the polarization axis. The retardation film RF may be a quarter wavelength ($\lambda/4$) retardation film having an optical axis twisted by about $\lambda/4$ ($\pm 45°$) with respect to the polarization axis of the linear polarization film LPF. Accordingly, the retardation film RF may circularly polarize a light incident thereto so that a vibration direction rotates.

The anti-reflective module RP may be disposed on the side surfaces of the lens LM. The linear polarization film LPF may include first, second, third, and fourth polarization parts LPP1, LPP2, LPP3, and LPP4. The first polarization part LPP1 is disposed between the first side surface SS1 and the first display part IDP1, and the second polarization part LPP2 is disposed between the second side surface SS2 and the second display part IDP2. The third polarization part LPP3 is disposed between the third side surface SS3 and the third display part IDP3, and the fourth polarization part LPP4 is disposed between the fourth side surface SS4 and the fourth display part IDP4. The first to fourth polarization parts LPP1 to LPP4 may be areas defined on one linear polarization film LPF.

However, the present disclosure should not be limited thereto or thereby, and the first to fourth polarization parts LPP1 to LPP4 may be manufactured as a separate film. That is, the linear polarization film LPF may include a first linear polarization film that defines the first polarization part LPP1, a second linear polarization film that defines the second polarization part LPP2, a third linear polarization film that defines the third polarization part LPP3, and a fourth linear polarization film that defines the fourth polarization part LPP4. As another embodiment, the linear polarization film LPF may include a first linear polarization film that provides the first polarization part LPP1 and the second polarization part LPP2 and a second linear polarization film that provides the third polarization part LPP3 and the fourth polarization part LPP4.

The retardation film RF may include first, second, third, and fourth retardation parts RTP1, RTP2, RTP3, and RTP4. The first retardation part RTP1 is disposed between the first polarization part LPP1 and the first display part IDP1, and the second retardation part RTP2 is disposed between the second polarization part LPP2 and the second display part IDP2. The third retardation part RTP3 is disposed between the third polarization part LPP3 and the third display part IDP3, and the fourth retardation part RTP4 is disposed between the fourth polarization part LPP4 and the fourth display part IDP4. The first to fourth retardation parts RTP1 to RTP4 may be areas defined in one retardation film RF.

However, the present disclosure should not be limited thereto or thereby, and the first to fourth retardation parts RTP1 to RTP4 may be manufactured as a separate film. That is, the retardation film RF may include a first retardation film that defines the first retardation part RTP1, a second retardation film that defines the second retardation part RTP2, a third retardation film that defines the third retardation part RTP3, and a fourth retardation film that defines the fourth retardation part RTP4.

In this case, the first retardation film and the first linear polarization film are coupled to each other to form a first anti-reflective module, the second retardation film and the second linear polarization film are coupled to each other to form a second anti-reflective module, the third retardation film and the third linear polarization film are coupled to each other to form a third anti-reflective module, and the fourth retardation film and the fourth linear polarization film are coupled to each other to form a fourth anti-reflective module.

In addition, as another example, the retardation film RF may include a first retardation film that provides the first retardation part RTP1 and the second retardation part RTP2 and a second retardation film that provides the third retardation part RTP3 and the fourth retardation part RTP4. In this case, the first retardation film and the first linear polarization film are coupled to each other to form a first anti-reflective module, and the second retardation film and the second linear polarization film are coupled to each other to form a second anti-reflective module. These embodiments will be described in detail later with reference to FIGS. 9 to 11.

For the convenience of explanation, FIGS. 1 and 2 show the exploded perspective view in which the side surfaces of the lens LM are disposed spaced apart from the anti-reflective module RP. However, the anti-reflective module RP and the display module DD may be coupled to each other to surround the lens. In this case, the anti-reflective module RP may be attached to the side surface of the lens LM. A separate adhesive layer may be interposed between the anti-reflective module RP and the side surfaces of the lens LM to fix the anti-reflective module RP to the side surface of the lens LM. As another embodiment, the anti-reflective module RP may be attached to an upper surface of the display module DD or may be formed in a layer form on the upper surface of the display module DD. In the exemplary embodiment, the upper surface of the display module DD may be defined as a surface through which the virtual image is displayed.

The first to fourth reflective mirrors RM1 to RM4 reflect the virtual image displayed through the display module DD to provide the virtual image to the user's eye HE. In detail, the first reflective mirror RM1 reflects the first image IM1 of the first display part IDP1 toward an exiting surface ES of the lens LM to provide the first image IM1 to the user's eye HE. The second reflective mirror RM2 reflects the second image IM2 of the second display part IDP2 toward the exiting surface ES of the lens LM, the third reflective mirror RM3 reflects the third image IM3 of the third display part IDP3 toward the exiting surface ES of the lens LM, and the fourth reflective mirror RM4 reflects the fourth image IM4 of the fourth display part IDP4 toward the exiting surface ES of the lens LM to provide the reflected image to the user's eye HE.

Each of the first to fourth reflective mirrors RM1 to RM4 allows the virtual image displayed through a corresponding display part among the display parts IDP1 to IDP4 of the display module DD to be focused on a retina of the user's eye HE. Accordingly, although the user focuses on a real image through the lens LM, the user may clearly see the virtual image shown in FIG. 3. That is, the user may clearly see the virtual image even though the user does not shift the focus on the real image.

The first to fourth reflective mirrors RM1 to RM4 may have a size smaller than a size of a pupil. As an example, each of the first to fourth reflective mirrors RM1 to RM4 may have a diameter of about 4 mm or less. In this case, since the user focuses on the real image, it is difficult for the user to recognize each of the first to fourth reflective mirrors RM1 to RM4. However, as the size of each of the first to fourth reflective mirrors RM1 to RM4 decreases, a brightness of the virtual image provided to the user's eye HE by the display module DD may be reduced. Therefore, the size of each of the first to fourth reflective mirrors RM1 to RM4 may be set by taking into account the above-mentioned aspects.

When the size of each of the first to fourth reflective mirrors RM1 to RM4 is smaller than the size of the pupil, each of the first to fourth reflective mirrors RM1 to RM4 exhibits a pinhole effect. Therefore, when the virtual image displayed through the display module DD is reflected by the first to fourth reflective mirrors RM1 to RM4, a depth of field becomes deep.

In FIG. 1, each of the first to fourth reflective mirrors RM1 to RM4 has a circular plate shape, however, each of the first to fourth reflective mirrors RM1 to RM4 may have an oval or polygonal plate shape rather than the circular plate shape. In addition, each of the first to fourth reflective mirrors RM1 to RM4 may have a curved shape.

Each of the first to fourth reflective mirrors RM1 to RM4 may be inclinedly disposed to face a corresponding display part among the display parts. In detail, the first reflective mirror RM1 is inclined at a first angle θ1 toward the first display part IDP1, and the second reflective mirror RM2 is inclined at a second angle toward the second display part IDP2. The third reflective mirror RM3 is inclined at a third angle θ3 toward the third display part IDP3, and the fourth reflective mirror RM4 is inclined at a fourth angle toward the fourth display part IDP4.

Each of the first to fourth angles may be set to provide the image from the display part to the user's eye. The first to fourth angles may be the same as or different from each other. As another example, the first and third angles θ1 and θ3 may be the same as each other, and the second and fourth angles θ2 and θ4 may be the same as each other.

The first to fourth reflective mirrors RM1 to RM4 may be arranged in a lozenge form. In this case, the first to fourth images IM1 to IM4 viewed to the user may have the lozenge form as shown in FIG. 3. The first image IM1 and the third image IM3 may not overlap with each other as shown in FIG. 3, and the second image IM2 and the fourth image IM4 may not overlap with each other as shown in FIG. 3. In FIG. 3, the first image IM1 overlaps with a portion of the second image IM2 and a portion of the fourth image IM4, and the third image IM3 overlaps with another portion of the second image IM2 and another portion of the fourth image IM4, however, they should not be limited thereto or thereby. That is, the first image IM1 may not overlap with each of the second image IM2 and the fourth image IM4, and the third image IM3 may not overlap with each of the second image IM2 and the fourth image IM4 by adjusting the distance between the first to fourth reflective mirrors RM1 to RM4 and the inclined angle of each of the first to fourth reflective mirrors RM1 to RM4.

Referring to FIG. 1 again, the augmented reality providing device ARD1 may further include a flexible circuit film FCB attached to one end of the display module DD. The flexible circuit film FCB may be attached to one end of the fourth display part IDP4 or one end of the first display part IDP1. As another example, in a case where there are many signal lines and voltage lines used to drive the display module DD, two flexible circuit films may be respectively attached to the one end of the first display part IDP1 and the one end of the fourth display part IDP4. The flexible circuit film FCB may be a flexible printed circuit board or a chip on film (COF).

The augmented reality providing device ARD1 may further include a driving circuit D-IC mounted on the flexible circuit film FCB. The driving circuit D-IC may provide data voltages, scan control signals, and a power voltage to the display module DD to drive the display module DD. The driving circuit D-IC may be mounted on the flexible circuit film FCB after being integrated in a chip form.

The augmented reality providing device ARD1 may further include an adhesive layer interposed between the anti-reflective module RP and the display module DD. The adhesive layer may be an optically clear resin (OCR) or an optically clear adhesive (OCA) film.

Figure 4:
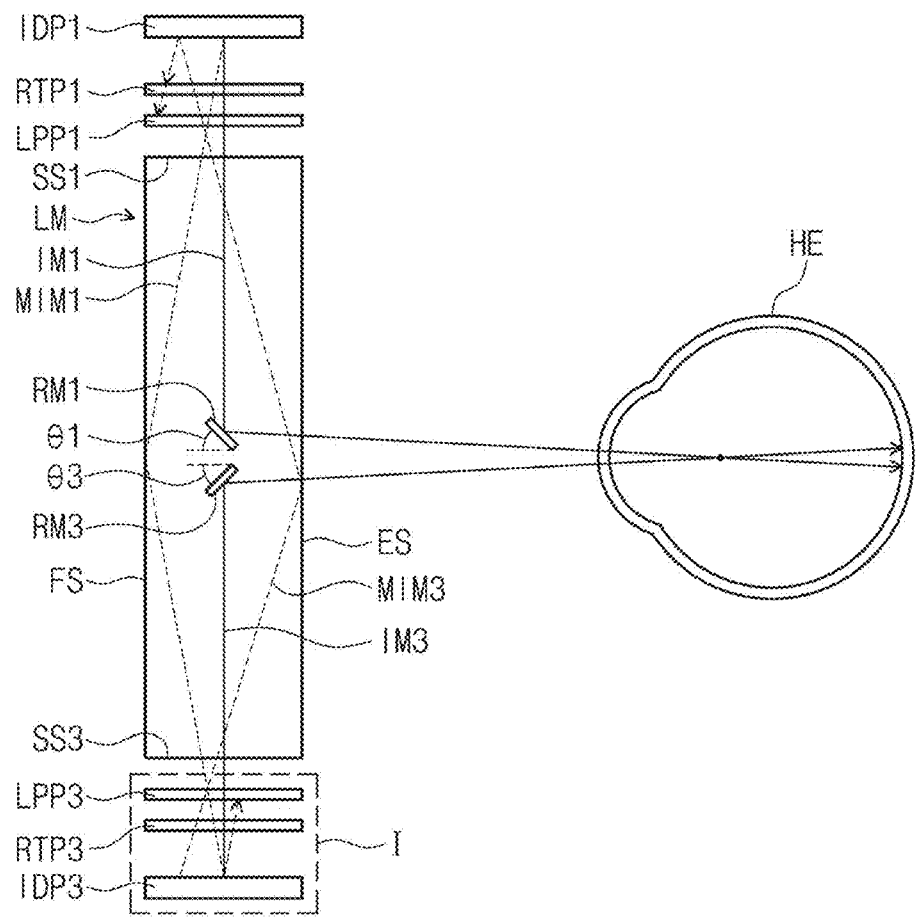
FIG. 4 is a view showing a function of an anti-reflective module.
Figure 5:
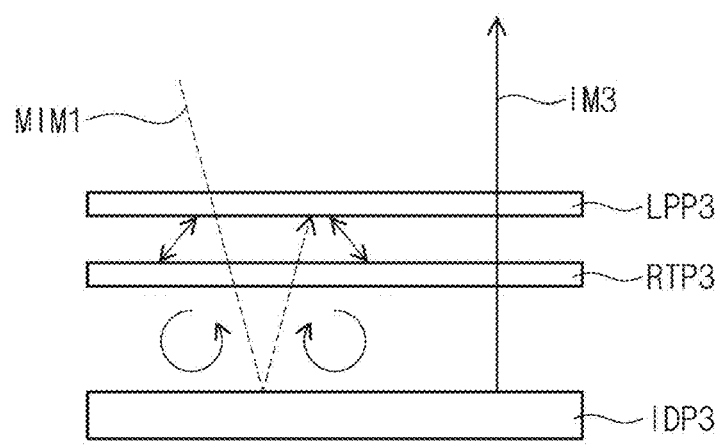
FIG. 5 is an enlarged view of the portion "I" shown in FIG. 4.

FIG. 4 is a view showing a function of an anti-reflective module, and FIG. 5 is an enlarged view of the portion "I" shown in FIG. 4. For the convenience of explanation, a function of the anti-reflective module RP disposed between the third display part IDP3 and the lens LM will be described as a representative example in a structure in which the first and third display parts IDP1 and IDP3 are disposed to face each other. The anti-reflective module RP disposed between the lens LM and the other display parts IDP1, IDP2, and IDP4 performs the same function, and thus details on the anti-reflective module RP disposed between the lens LM and the other display parts IDP1, IDP2, and IDP4 may be omitted.

Referring to FIGS. 4 and 5, the first image IM1 is output from the first display part IDP1. For the convenience explanation, an image provided to the user's eye HE through the exiting surface ES of the lens LM after being reflected by the first reflective mirror RM1 of the first image IM1 may be referred to as a "normal image NIM". An image provided to the third display part IDP3 of the first image IM1 may be referred to as a "first mirror image MIM1".

FIG. 4 shows an example in which the first image IM1 is provided to the third display part IDP3 after being reflected by an opposite surface FS facing the exiting surface ES of the lens LM, however, it should not be limited thereto or thereby. That is, the first image IM1 may be provided to the third display part IDP3 after being reflected several times by the lens LM or may be directly provided to the third display part IDP3 without being reflected by the lens LM.

The first mirror image MIM1 incident onto the third display part IDP3 may be reflected by the third display part IDP3. For example, the first mirror image MIM1 may be reflected by a pixel electrode disposed in the third display part IDP3. However, the first mirror image MIM1 reflected by the third display part IDP3 may not be incident into the lens LM again due to the anti-reflective module RP.

In detail, as shown in FIG. 5, the light forming the first mirror image MIM1 is linearly polarized by the third polarization part LPP3. In a case where the third polarization part LPP3 has a polarization axis substantially parallel to the first direction DR1, the light forming the first mirror image MIM1 is linearly polarized and output with a light having a component substantially parallel to the first direction DR1 (hereinafter, referred to as a "first linearly polarized light component"). The first linearly polarized light component of the first mirror image MIM1 may be circularly polarized while passing through the third retardation part RTP3. As an example, the third retardation part RTP3 may left circularly polarize the first linearly polarized light component. That is, the first linearly polarized light component is changed to a first circularly polarized light component by the third retardation part RTP3.

The first circularly polarized light component is reflected by the third display part IDP3, and thus a rotation direction of the first circularly polarized light component may be reversed. That is, when the first circularly polarized light component is a left circularly polarized light component, the first circularly polarized light component may be reversed to a right circularly polarized light component (hereinafter, referred to as a "second circularly polarized light component"), and when the first circularly polarized light component is the right circularly polarized light component, the first circularly polarized light component may be reversed to the left circularly polarized light component.

The second circularly polarized light component reflected by the third display part IDP3 is linearly polarized while passing through the third retardation part RTP3. The light linearly polarized by the third retardation part RTP3 is referred to as a "second linearly polarized light component". The second linearly polarized light component forms an angle of about 90° with the polarization axis of the third polarization part LPP3. Accordingly, the second linearly polarized light component is blocked by the third polarization part LPP3 without passing through the third polarization part LPP3. Therefore, the light forming the first mirror image MIM1 may be removed without passing through the third polarization part LPP3.

Due to the same principle, a third mirror image MIM3 provided to the first display part IDP1 among the third image IM3 output from the third display part IDP3 may be removed without passing through the first polarization part LPP1. Constituent lights of the third mirror image MIM3 may be removed without passing through the first polarization part LPP1. Thus, a phenomenon by which the first and third mirror images MIM1 and MIM3 are provided to the user's eye HE and overlap with the normal image may be prevented or substantially reduced.

Figure 6A:
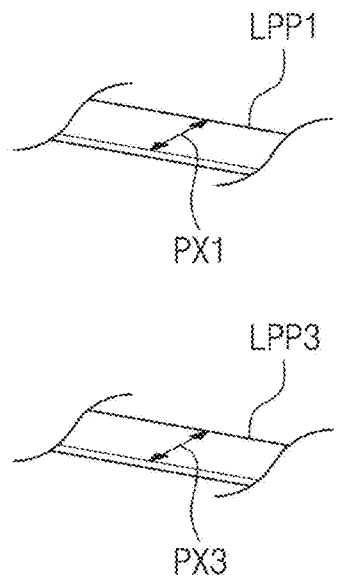
FIG. 6A is a view showing a parallel relationship between polarization axes of two polarization parts facing each other according to an exemplary embodiment of the present disclosure.
Figure 6B:
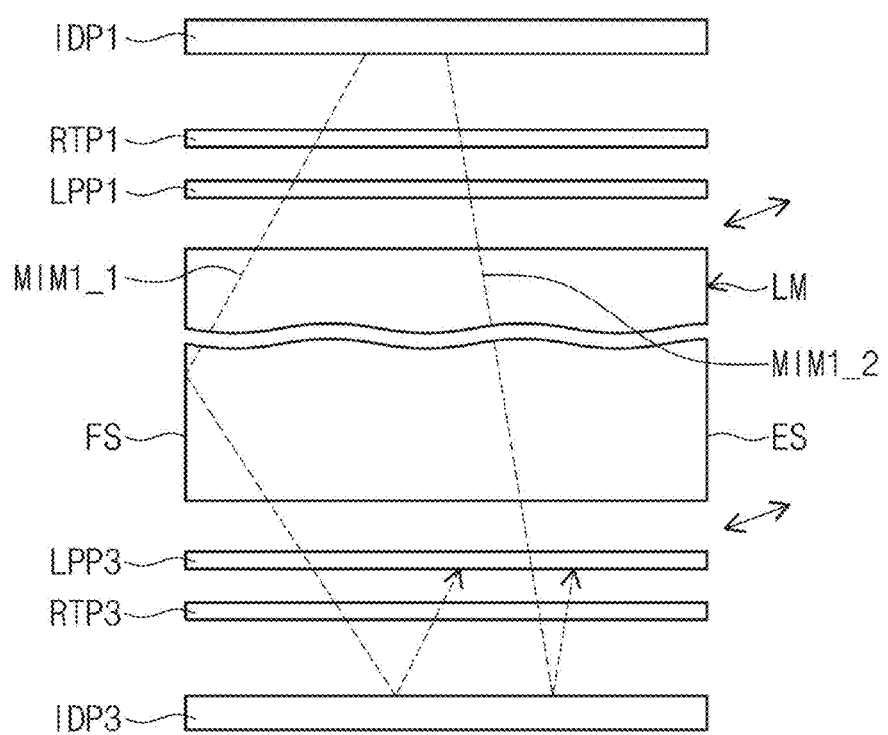
FIG. 6B is a view showing a process of removing a mirror image by first and third polarization parts whose polarization axes are parallel to each other.

FIG. 6A is a view showing a parallel relationship between polarization axes of two polarization parts facing each other according to an exemplary embodiment of the present disclosure, and FIG. 6B is a view showing a process of removing a mirror image by first and third polarization parts whose polarization axes are parallel to each other.

Referring to FIGS. 1 and 6A, the two polarization parts of the augmented reality providing device ARD1 that are facing each other may have polarization axes parallel to each other. As an example, the first and third polarization parts LPP1 and LPP3 of the linear polarization film may be disposed to face each other, and the second and fourth polarization parts LPP2 and LPP4 of the linear polarization film may be disposed to face each other. In this case, the first and third polarization parts LPP1 and LPP3 may respectively have polarization axes that are substantially parallel to each other, and the second and fourth polarization parts LPP2 and LPP4 may respectively have polarization axes that are substantially parallel to each other. In addition, the polarization axes of the first to fourth polarization parts LPP1 to LPP4 may be substantially parallel to each other.

Referring to FIG. 6B, the first image IM1 output from the first display part IDP1 has a component substantially parallel to a first polarization axis PX1 after passing through the first polarization part LPP1. Since the third polarization part LPP3 has a third polarization axis PX3 substantially parallel to that of the first polarization part LPP1, the mirror images MIM1_1 and MIM1_2 provided to the third display part IDP3 of the first image IM1 may pass through the third polarization part LPP3. However, the mirror images MIM1_1 and MIM1_2 are changed to light of the component perpendicular to the third polarization axis PX3 by the third retardation part RTP3 after being reflected by the third display part IDP3. Accordingly, the mirror images MIM1_1 and MIM1_2 reflected by the third display part IDP3 do not pass through the third polarization part LPP3.

The third image IM3 output from the third display part IDP3 has a component substantially parallel to the third polarization axis PX3 after passing through the third polarization part LPP3. Since the first polarization part LPP1 has the first polarization axis PX1 substantially parallel to that of the third polarization part LPP3, the mirror image provided to the first display part IDP1 of the third image IM3 may pass through the first polarization part LPP1. However, the mirror image is changed to light of the component perpendicular to the first polarization axis PX1 by the first retardation part RTP1 after being reflected by the first display part IDP1. Accordingly, the mirror image reflected by the first display part IDP1 does not pass through the first polarization part LPP1.

As described above, the image output from each display part may be prevented or substantially prevented from being provided to the user's eye after being reflected by the display part facing thereto. Accordingly, a phenomenon by which the user views the normal image overlaid on the mirror image may be prevented or substantially prevented, and as a result, the user may see a more clear image.

Figure 7A:
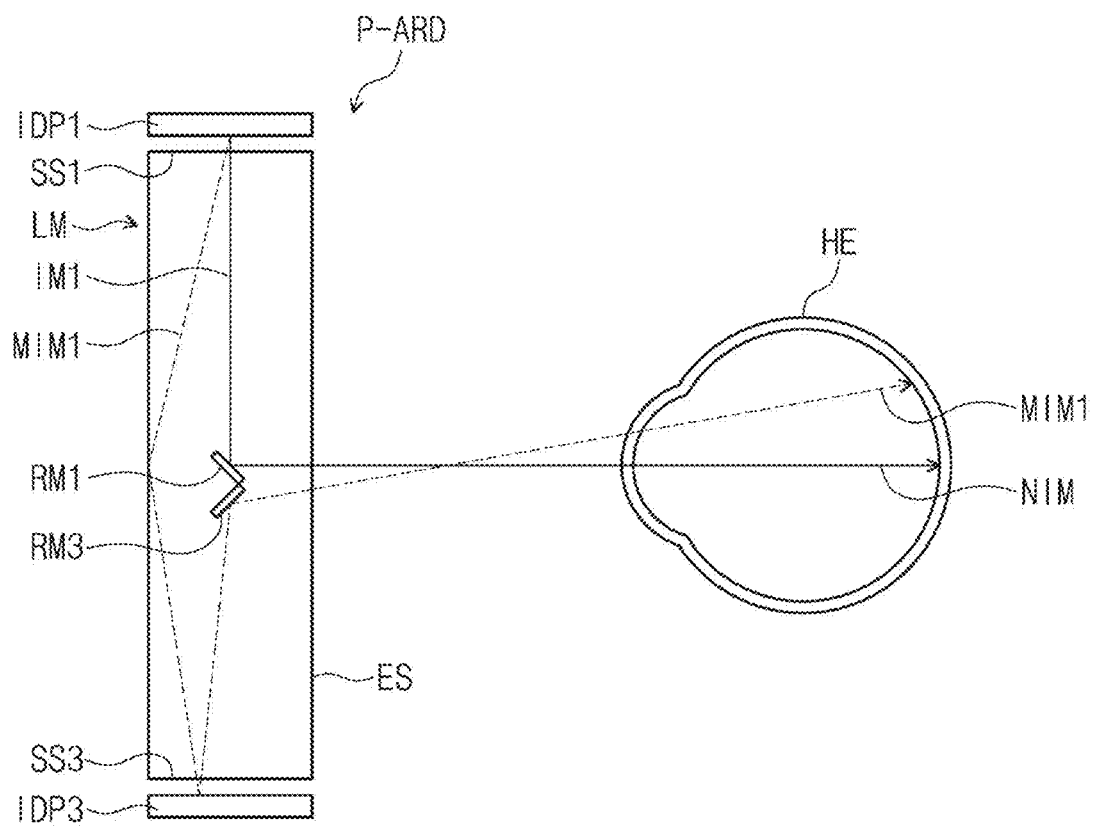
FIG. 7A is a view showing a process in which a mirror image is provided to a user's eye according to a conventional augmented reality providing device.
Figure 8A:
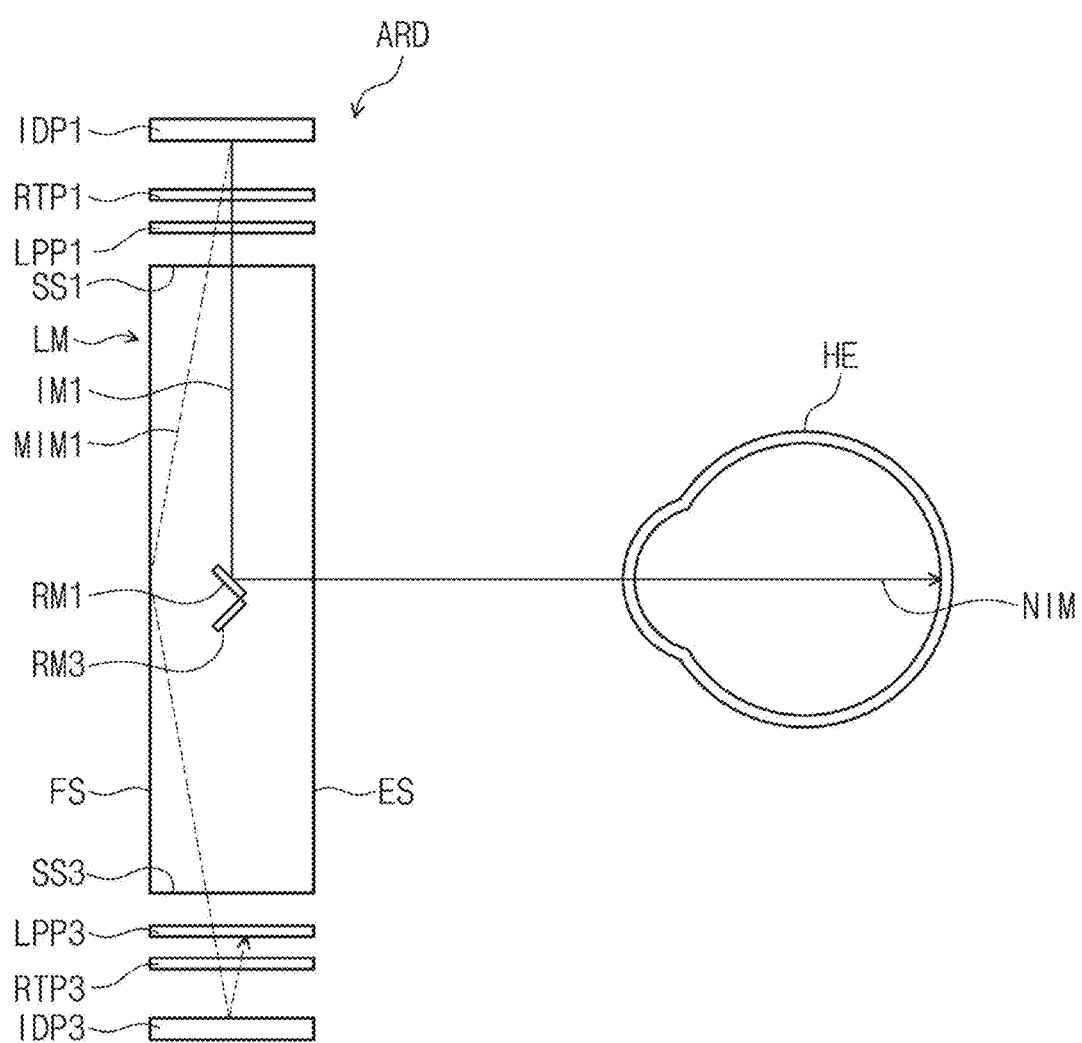
FIG. 8A is a view showing a process of removing a mirror image by an augmented reality providing device according to an exemplary embodiment of the present disclosure.

FIG. 7A is a view showing a process in which a mirror image is provided to a user's eye according to a conventional augmented reality providing device P-ARD, and FIG. 7B is a view showing an image perceived by the user through the conventional augmented reality providing device P-ARD. FIG. 8A is a view showing a process of removing a mirror image by an augmented reality providing device according to an exemplary embodiment of the present disclosure, and FIG. 8B is a view showing an image perceived by the user through the augmented reality providing device according to an exemplary embodiment of the present disclosure.

Referring to FIGS. 7A and 7B, according to the conventional augmented reality providing device P-ARD, a mirror image MIM1 output from a first display part IDP1 and provided to a third display part IDP3 is reflected by the third display part IDP3. The mirror image MIM1 reflected by the third display part IDP3 is reflected by a third reflective mirror RM3 and provided to the user's eye HE.

Accordingly, an image on a retina of the user's eye HE may be an image in which a normal image NIM, which is a first image IM1 incident after being reflected by a first reflective mirror RM1, is being overlaid on the mirror image MIM1 incident after being reflected by the third reflective mirror RM3.

Therefore, when using the conventional augmented reality providing device P-ARD, the user sees and recognizes the image in which the normal image NIM overlaps with the mirror image MIM1 rather than the clear normal image NIM.

Referring to FIGS. 8A and 8B, according to the augmented reality providing device ARD of the present disclosure, the mirror image MIM1 output from the first display part IDP1 and provided to the third display part IDP3 is reflected by the third display part IDP3. However, the reflected mirror image MIM1 is blocked by the third polarization part LPP3 and the third retardation part RTP3 and is not provided to the third reflective mirror RM3.

Accordingly, the image formed on the retina of the user's eye HE may include only the normal image NIM that is the first image IM1 incident after being reflected by the first reflective mirror RM1. That is, the user's eye HE may recognize only the normal image NIM that is the first image IM1 incident after being reflected by the first reflective mirror RM1, and as a result, the user may see a more clear image.

Figure 9:
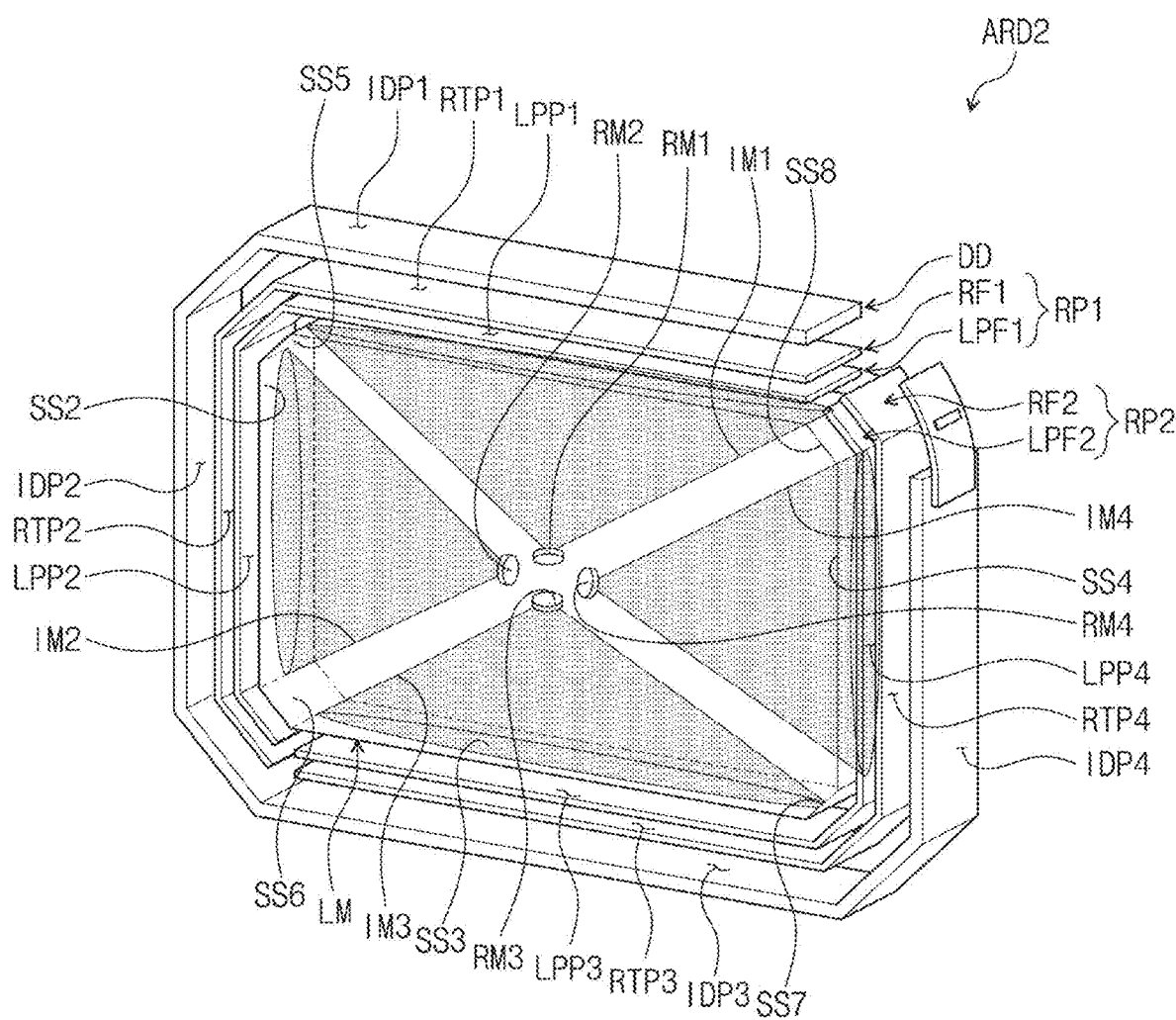
FIG. 9 is an exploded perspective view showing an augmented reality providing device according to another exemplary embodiment of the present disclosure.
Figure 10A:
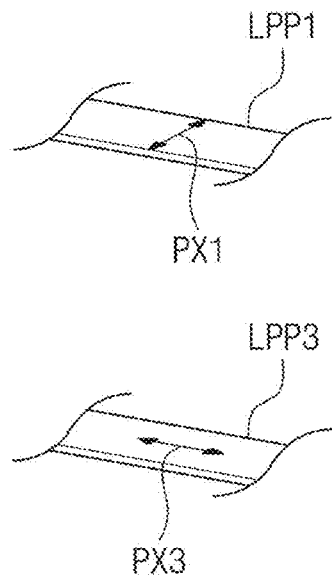
FIG. 10A is a view showing a vertical relationship between polarization axes of two polarization parts facing each other according to an exemplary embodiment of the present disclosure.
Figure 10B:
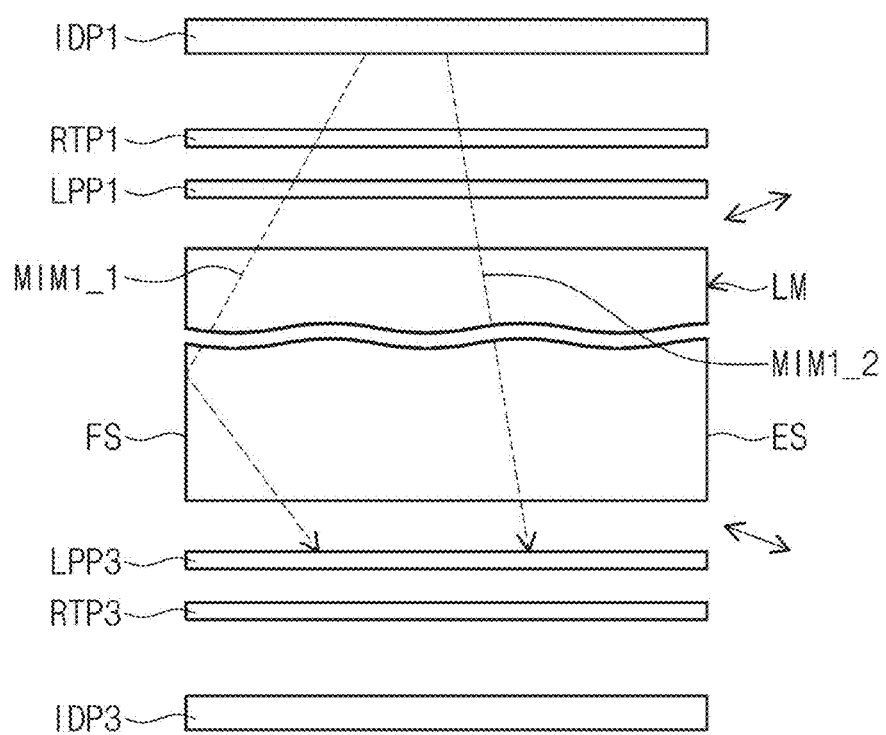
FIG. 10B is a view showing a process of removing a mirror image by first and third polarization parts whose polarization axes are vertical to each other.

FIG. 9 is an exploded perspective view showing an augmented reality providing device ARD2 according to another exemplary embodiment of the present disclosure. FIG. 10A is a view showing a vertical relationship between polarization axes of two polarization parts facing each other according to an exemplary embodiment of the present disclosure, and FIG. 10B is a view showing a process of removing a mirror image by first and third polarization parts whose polarization axes are vertical to each other.

The augmented reality providing device ARD2 shown in FIG. 9 according to another exemplary embodiment of the present disclosure has the same structure as that of the augmented reality providing device ARD1 shown in FIG. 1 except that the anti-reflective module RP (refer to FIG. 1) is divided into first and second anti-reflective modules RP1 and RP2.

Referring to FIG. 9, the augmented reality providing device ARD2 may include the first anti-reflective module RP1 and the second anti-reflective module RP2. The first anti-reflective module RP1 includes a first retardation film RF1 and a first linear polarization film LPF1, and the second anti-reflective module RP2 includes a second retardation film RF2 and a second linear polarization film LPF2.

The first retardation film RF1 includes a first retardation part RTP1 corresponding to a first display part IDP1 and a second retardation part RTP2 corresponding to a second display part IDP2. The first linear polarization film LPF1 includes a first polarization part LPP1 corresponding to a first side surface SS1 of a lens LM and a second polarization part LPP2 corresponding to a second side surface SS2 of the lens LM.

The second retardation film RF2 includes a third retardation part RTP3 corresponding to a third display part IDP3 and a fourth retardation part RTP4 corresponding to a fourth display part IDP4. The second linear polarization film LPF2 includes a third polarization part LPP3 corresponding to a third side surface SS3 of the lens LM and a fourth polarization part LPP4 corresponding to a fourth side surface SS4 of the lens LM.

The first and second retardation films RF1 and RF2 may be separated from each other, and the first and second linear polarization films LPF1 and LPF2 may be separated from each other.

Referring to FIGS. 9 and 10A, two polarization parts of the augmented reality providing device ARD2 that are facing each other may have polarization axes perpendicular to each other. As an example, the first polarization part LPP1 of the first linear polarization film LPF1 and the third polarization part LPP3 of the second linear polarization film LPF2 are disposed to face each other. The second polarization part LPP2 of the first linear polarization film LPF1 and the fourth polarization part LPP4 of the second linear polarization film LPF2 are disposed to face each other.

In the present exemplary embodiment, the first and third polarization parts LPP1 and LPP3 may have the polarization axes perpendicular to each other, and the second and fourth polarization parts LPP2 and LPP4 may have the polarization axes perpendicular to each other. In addition, the polarization axes of the first and second polarization parts LPP1 and LPP2 may be substantially parallel to each other, and the polarization axes of the third and fourth polarization parts LPP3 and LPP4 may be substantially parallel to each other.

Referring to FIG. 10B, the first image IM1 output from the first display part IDP1 has a component substantially parallel to a first polarization axis PX1 after passing through the first polarization part LPP1. Since the third polarization part LPP3 has a third polarization axis PX3 substantially perpendicular to that of the first polarization part LPP1, the mirror images MIM1_1 and MIM1_2 provided to the third display part IDP3 of the first image IM1 may not pass through the third polarization part LPP3. Accordingly, most of the mirror images MIM1_1 and MIM1_2 are blocked by the third polarization part LPP3 and are not incident into the third display part IDP3. Some components of the mirror images MIM1_1 and MIM1_2 whose phases are shifted while passing through the lens LM may pass through the third polarization part LPP3. However, since the light that has passed through the third polarization part LPP3 is blocked again by the third polarization part LPP3 after being reflected by the third display part IDP3, the mirror images MIM1_1 and MIM1_2 may be prevented or substantially prevented from re-entering the lens LM.

As described above, even though the polarization axes of the two polarization parts facing each other are perpendicular to each other, the image output from each display part may be prevented or substantially prevented from being provided to the user's eye after being reflected by the display part facing thereto. Accordingly, a phenomenon by which the user views the normal image overlaid on the mirror image may be prevented or substantially prevented, and as a result, the user may see a more clear image.

Figure 11:
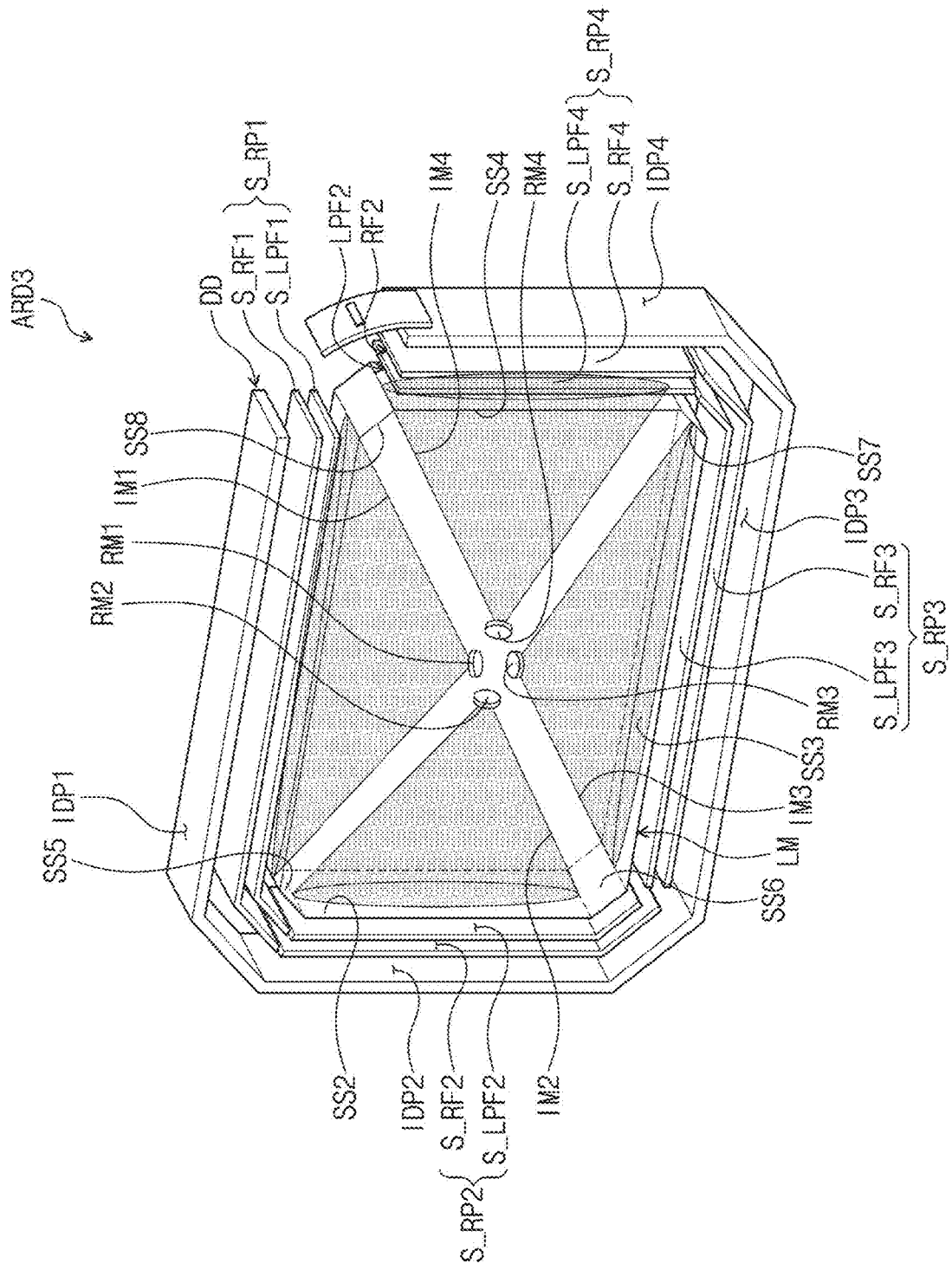
FIG. 11 is an exploded perspective view showing an augmented reality providing device according to another exemplary embodiment of the present disclosure.

FIG. 11 is an exploded perspective view showing an augmented reality providing device ARD3 according to another exemplary embodiment of the present disclosure.

Referring to FIG. 11, the augmented reality providing device ARD3 includes a first anti-reflective module S_RP1, a second anti-reflective module S_RP2, a third anti-reflective module S_RP3, and a fourth anti-reflective module S_RP4.

The first anti-reflective module S_RP1 includes a first retardation film S_RF1 and a first linear polarization film S_LPF1, and the second anti-reflective module S_RP2 includes a second retardation film S_RF2 and a second linear polarization film S_LPF2. The third anti-reflective module S_RP3 includes a third retardation film S_RF3 and a third linear polarization film S_LPF3, and the fourth anti-reflective module S_RP4 includes a fourth retardation film S_RF4 and a fourth linear polarization film S_LPF4.

The first retardation film S_RF1 corresponds to a first display part IDP1, and the second retardation film S_RF2 corresponds to a second display part IDP2. The first linear polarization film S_LPF1 corresponds to a first side surface SS1 of a lens LM, and the second linear polarization film S_LPF2 corresponds to a second side surface SS2 of the lens LM. The third retardation film S_RF3 corresponds to a third display part IDP3, and the fourth retardation film S_RF4 corresponds to a fourth display part IDP4. The third linear polarization film S_LPF3 corresponds to a third side surface SS3 of the lens LM, and the fourth linear polarization film S_LPF4 corresponds to a fourth side surface SS4 of the lens LM.

The first to fourth retardation films S_RF1 to S_RF4 may be separated from each other, and the first to fourth linear polarization films S_LPF1 to S_LPF4 may be separated from each other.

The augmented reality providing device ARD3 shown in FIG. 11 may be substantially the same as the augmented reality providing devices ARD1 and ARD2 shown in FIGS. 1 and 9 except that the retardation film RF is divided into the first to fourth retardation films S_RF1 to S_RF4 and the linear polarization film LPF is divided into the first to fourth linear polarization films S_LPF1 to S_LPF4. In the present embodiment, the first and third linear polarization films S_LPF1 and S_LPF3 facing each other may have polarization axes that are substantially parallel to each other or substantially perpendicular to each other, and the second and fourth linear polarization films S_LPF2 and S_LPF4 facing each other may have polarization axes that are substantially parallel to each other or substantially perpendicular to each other. In a case where the first to fourth linear polarization films S_LPF1 to SLPF4 are independently arranged, a degree of freedom is achieved in forming the polarization axis of each linearly polarized light film.

As described above, the augmented reality providing device ARD3 shown in FIG. 11 may prevent or substantially prevent the image output from each display part from being provided to the user's eye after being reflected by the display part facing thereto. Accordingly, a phenomenon by which the user views the normal image overlaid on the mirror image may be prevented or substantially prevented, and as a result, the user may see a more clear image.

Figure 12:
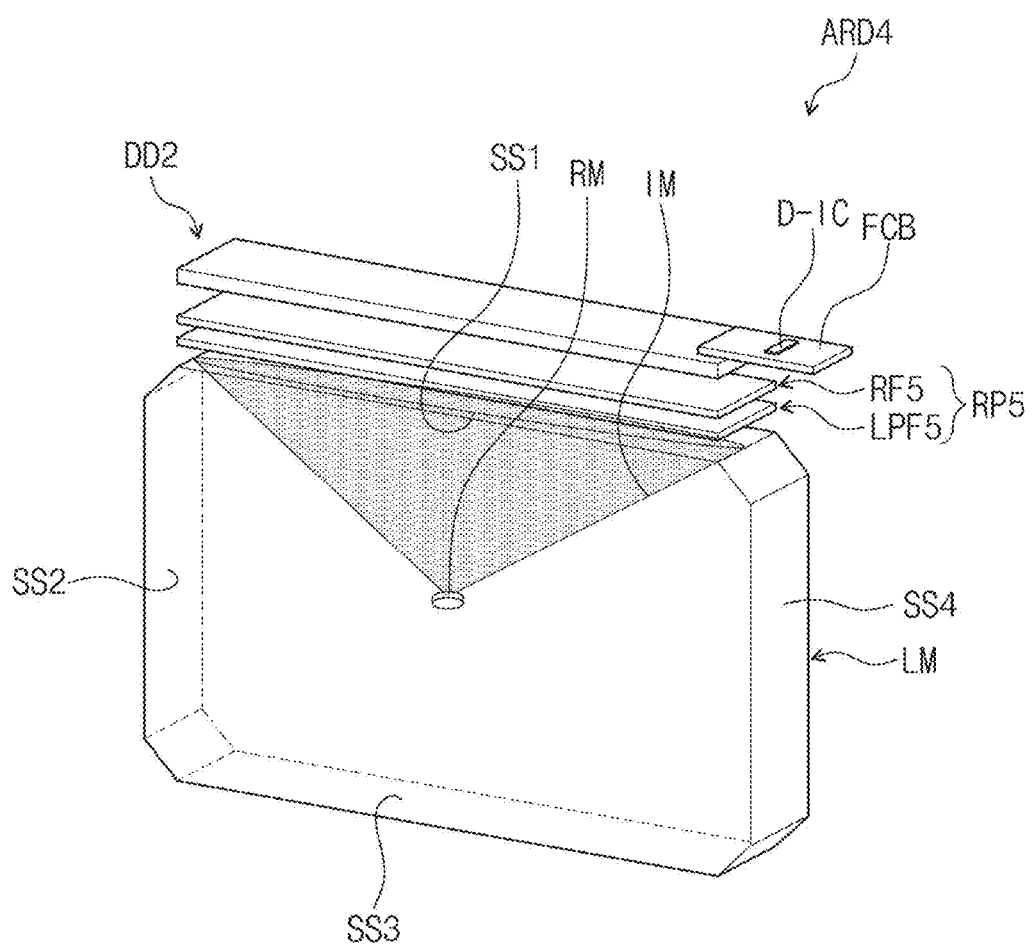
FIG. 12 is an exploded perspective view showing an augmented reality providing device according to another exemplary embodiment of the present disclosure.
Figure 13:
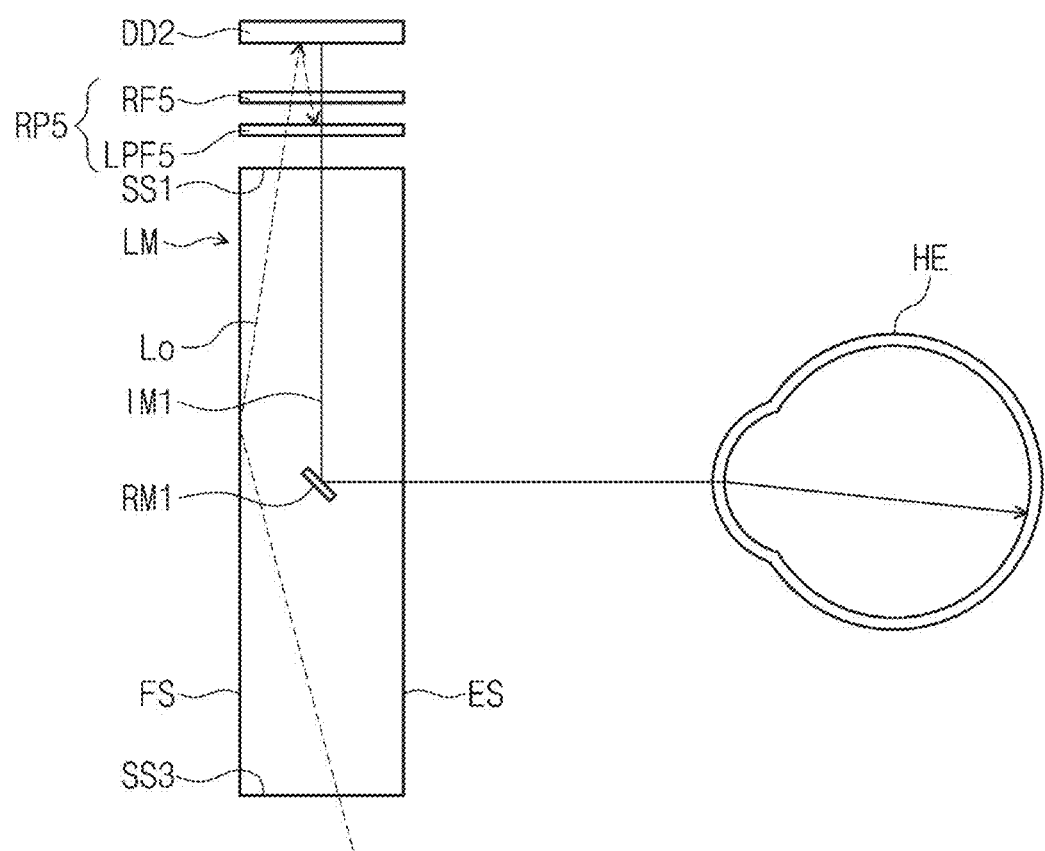
FIG. 13 is a cross-sectional view showing a process of blocking an external light by the augmented reality providing device shown in FIG. 12.

FIG. 12 is an exploded perspective view showing an augmented reality providing device ARD4 according to another exemplary embodiment of the present disclosure, and FIG. 13 is a cross-sectional view showing a process of blocking an external light by the augmented reality providing device ARD4 shown in FIG. 12.

Referring to FIGS. 12 and 13, the augmented reality providing device ARD4 according to another exemplary embodiment of the present disclosure includes a display module DD2 disposed closer to a first side surface SS1 of a lens LM. The display module DD2 displays a virtual image IM at the first side surface SS1 of the lens LM. The lens LM includes a reflective mirror RM to reflect an image provided through the first side surface SS1 toward an exiting surface ES of the lens LM.

The augmented reality providing device ARD4 includes an anti-reflective module RP5 disposed between the display module DD2 and the first side surface SS1. The anti-reflective module RP5 includes a retardation film RF5 and a linear polarization film LPF5. The retardation film RF5 is disposed closer to (e.g., more near) the display module DD2 than the linear polarization film LPF5, and the linear polarization film LPF5 is disposed adjacent to the first side surface SS1 of the lens LM and closer to the first side surface SS1 of the lens LM than the retardation film RF5.

An external light Lo may be incident into the lens LM through other surfaces except for the first side surface SS1 on which the display module DD2 is disposed. Some of the incident external light Lo may be provided to the display module DD2. The anti-reflective module RF5 may prevent or substantially prevent the external light Lo incident into the display module DD2 from re-entering the lens LM after being reflected by the display module DD2.

The process of blocking the external light Lo by the anti-reflective module RF5 is substantially the same as the process of FIG. 5; therefore, a detailed description thereof may not be repeated.

Accordingly, the augmented reality providing device ARD4 shown in FIGS. 12 and 13 may prevent or substantially prevent the external light Lo from being provided to the user's eye after being reflected by the display module DD2. Accordingly, a phenomenon by which the user views the normal image overlaid on the mirror image may be prevented or substantially prevented, and as a result, the user may see a more clear image.

Figure 14:
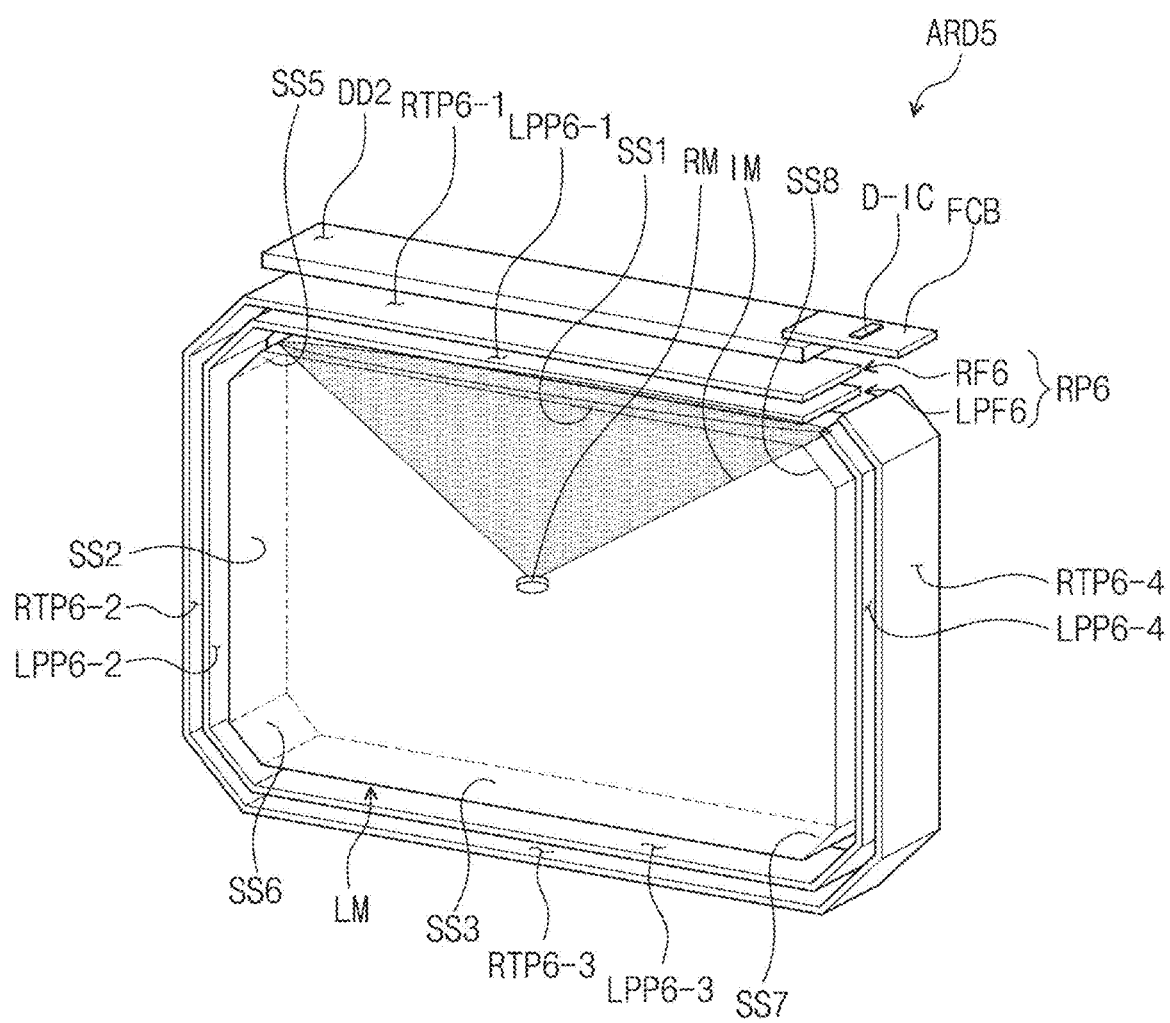
FIG. 14 is an exploded perspective view showing an augmented reality providing device according to another exemplary embodiment of the present disclosure.
Figure 15:
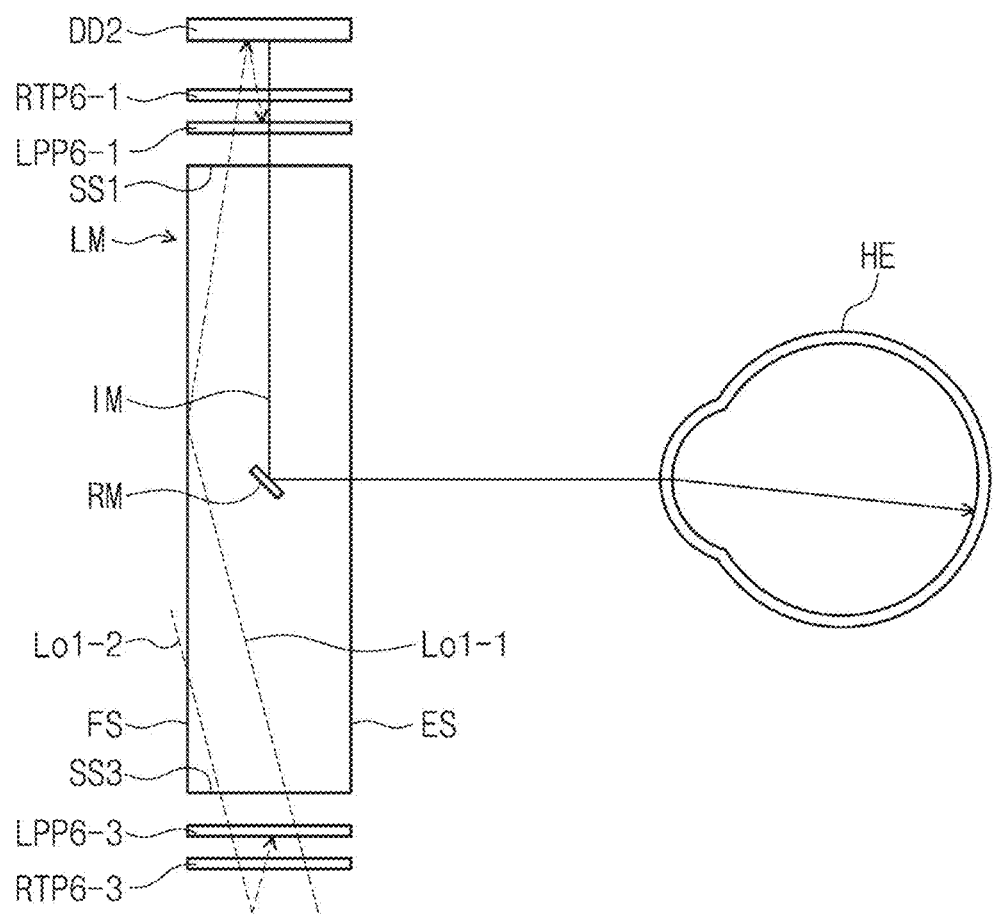
FIG. 15 is a cross-sectional view showing a process of blocking an external light by the augmented reality providing device shown in FIG. 14.

FIG. 14 is an exploded perspective view showing an augmented reality providing device ARD5 according to another exemplary embodiment of the present disclosure, and FIG. 15 is a cross-sectional view showing a process of blocking an external light by the augmented reality providing device ARD5 shown in FIG. 14.

Referring to FIG. 14, the augmented reality providing device ARD5 according to another exemplary embodiment of the present disclosure includes an anti-reflective module RP6 disposed between a display module DD2 and a lens LM. The augmented reality providing device ARD5 may have substantially the same structure as that of the augmented reality providing device ARD4 except that the anti-reflective module RP6 surrounds side surfaces of the lens LM.

The anti-reflective module RP6 includes a retardation film RF6 and a linear polarization film LPF6. The linear polarization film LPF6 has a bent shape to surround the side surfaces SS1 to SS8 of the lens LM, and the retardation film RF6 is disposed to surround the linear polarization film LPF6.

As shown in FIGS. 14 and 15, the anti-reflective module RP6 is disposed between the first side surface SS1 on which the display module DD2 is disposed and the display module DD2, and the anti-reflective module RP6 is also disposed on the third side surface SS3 opposite to the first side surface SS1. That is, the linear polarization film LPF6 includes first, second, third, and fourth polarization parts LPP6_1, LPP6_2, LPP6_3, and LPP6_4 respectively corresponding to (e.g., facing and parallel to) first, second, third, and fourth side surfaces SS1, SS2, SS3, and SS4 of the lens LM. The retardation film RF6 includes first, second, third, and fourth retardation parts RTP6_1, RTP6_2, RTP6_3, and RTP6_4 respectively corresponding to (e.g., facing and parallel to) the first, second, third, and fourth polarization parts LPP6_1, LPP6_2, LPP6_3, and LPP6_4.

The first polarization part LPP6_1 is disposed between the display module DD2 and the first side surface SS1 of the lens LM, and the first retardation part RTP6_1 is disposed between the first polarization part LPP6_1 and the display module DD2. The third polarization part LPP6_3 is disposed on the third side surface SS3 of the lens LM, and the third retardation part RTP6_3 is disposed on the third polarization part LPP6_3.

A first external light Lo1-1 may be defined as a light incident onto the third side surface SS3 of the lens LM after passing through the third retardation part RTP6_3 and the third polarization part LPP6_3, and a second external light Lo1-2 may be defined as a light incident through a facing surface FS facing an exiting surface ES of the lens LM.

The first external light Lo1-1 may be incident into the display module DD2 and may be reflected by the display module DD2. The first external light Lo1-1 that has passed through the third polarization part LPP6_3 passes through the first polarization part LPP6_1 having a polarization axis substantially parallel to that of the third polarization part LPP6_3 and is incident into the display module DD2. The display module DD2 may reflect the first external light Lo1-1. The reflected first external light Lo1-1 is blocked without passing through the first polarization part LPP6_1. Since the principle that the reflected first external light Lo1-1 is blocked without passing through the first polarization part LPP6_1 has already been described with reference to FIG. 5, details thereof will be omitted. Accordingly, the first external light Lo1-1 may be prevented or substantially prevented from being provided to the user's eye after being reflected by a reflective mirror RM.

The second external light Lo1-2 is incident through the facing surface FS and passes through the third retardation part RTP6_3 and the third polarization part LPP6_3 via the third side surface SS3. Then, even though the second external light Lo1-2 is reflected by an external object, the second external light Lo1-2 may be blocked without passing through the third polarization part LPP6_3. Accordingly, the second external light Lo1-2 may be prevented or substantially prevented from being provided to the user's eye after being reflected by the reflective mirror RM.

Since the augmented reality providing device ARD5 shown in FIGS. 14 and 15 includes the anti-reflective module RP6 that covers all the side surfaces of the lens LM, the external lights Lo1-1 and Lo1-2 may be more effectively prevented from being provided to the user's eye HE after being reflected by the display module DD2. Accordingly, a phenomenon by which the user views the normal image overlaid on the external light image may be prevented or substantially prevented, and as a result, the user may see a more clear image.

Figure 16:
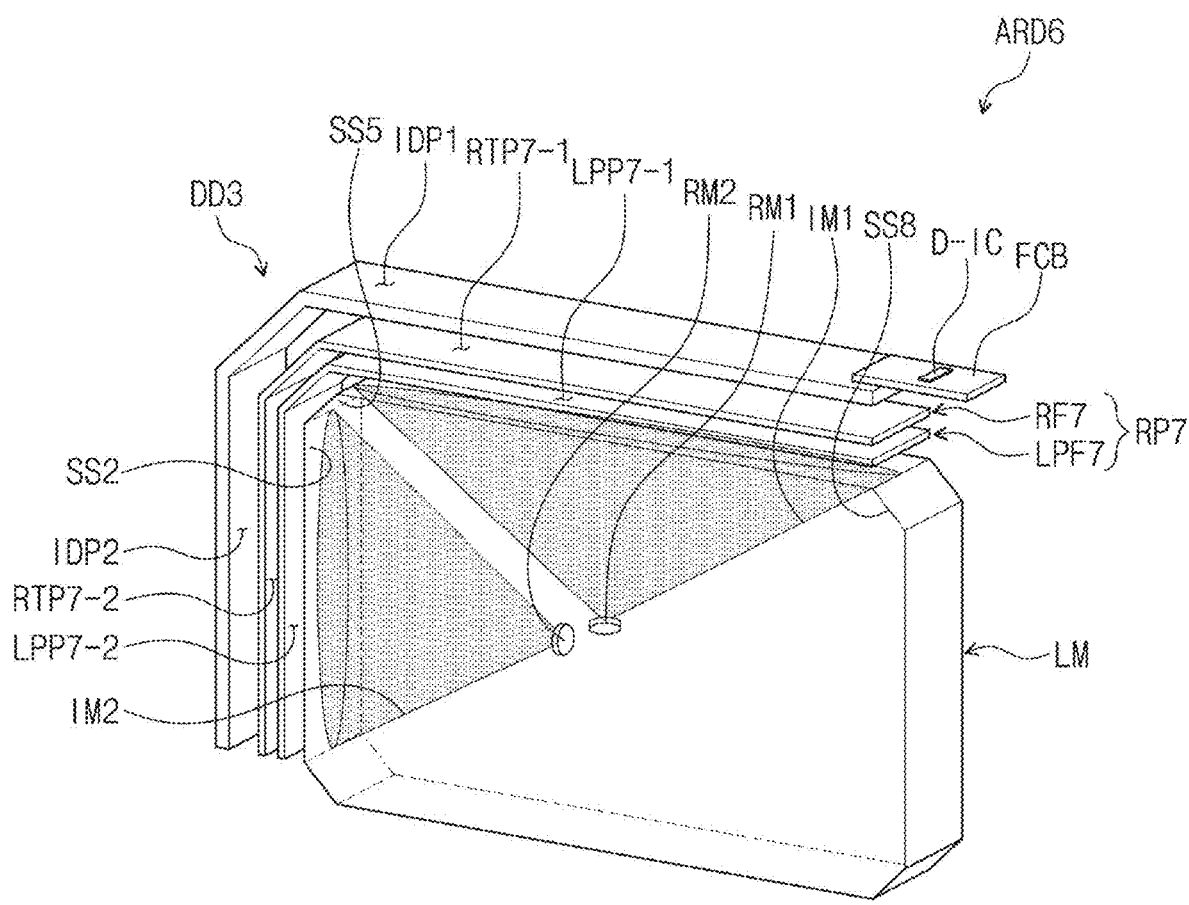
FIG. 16 is an exploded perspective view showing an augmented reality providing device according to another exemplary embodiment of the present disclosure.
Figure 17:
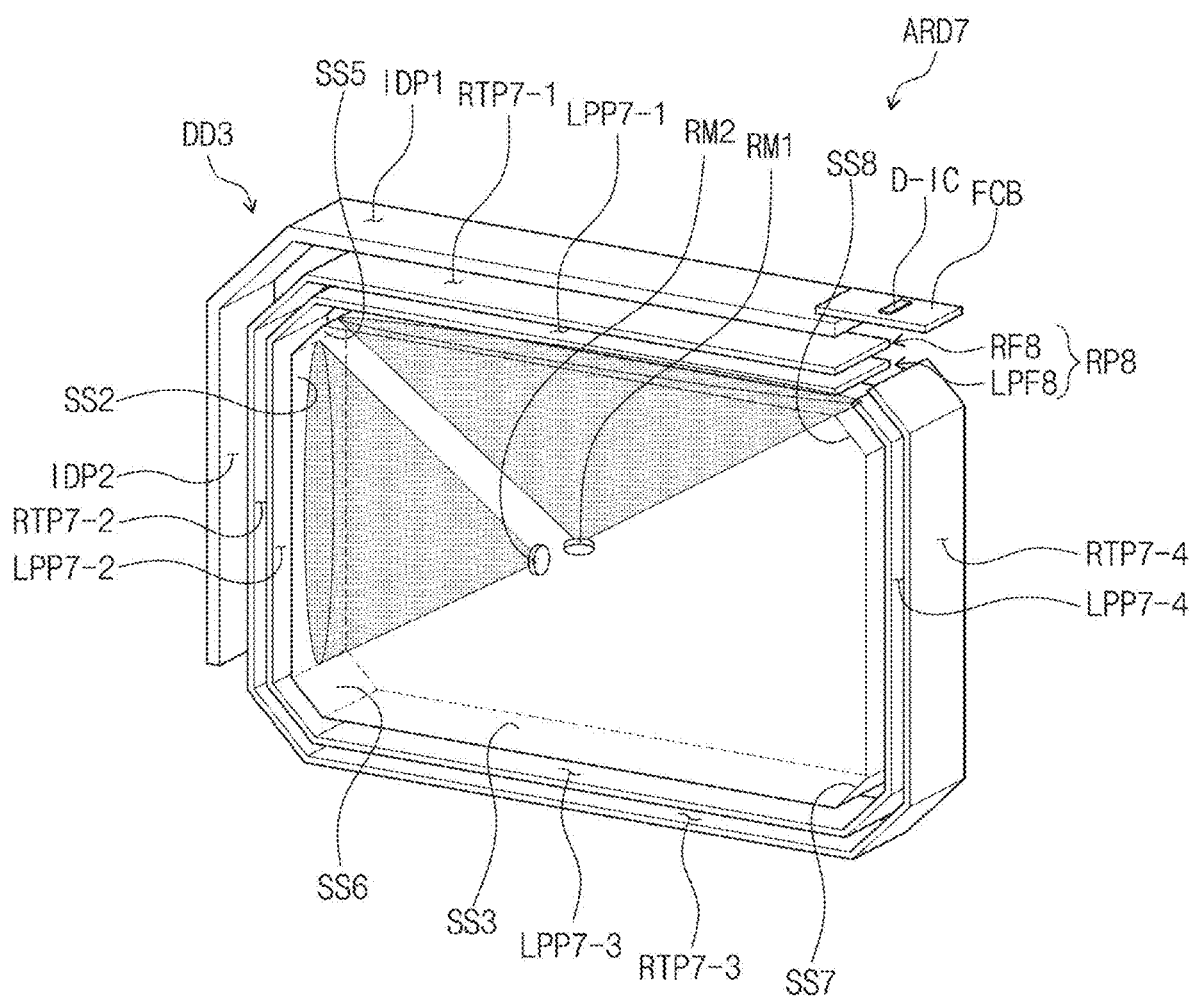
FIG. 17 is an exploded perspective view showing an augmented reality providing device according to another exemplary embodiment of the present disclosure.

FIG. 16 is an exploded perspective view showing an augmented reality providing device ARD6 according to another exemplary embodiment of the present disclosure, and FIG. 17 is an exploded perspective view showing an augmented reality providing device ARD7 according to another exemplary embodiment of the present disclosure.

Referring to FIG. 16, the augmented reality providing device ARD6 according to another exemplary embodiment of the present disclosure includes a display module DD3 including first and second display parts IDP1 and IDP2. The first display part IDP1 of the display module DD3 is disposed closer to a first side surface SS1 of the lens LM, and the second display part IDP2 is disposed by a second side surface SS2 of the lens LM. The first display part IDP1 of the display module DD3 displays a virtual image at the first side surface SS1 of the lens LM, and the second display part IDP2 of the display module DD3 displays the virtual image at the second side surface SS2 of the lens LM.

The lens LM includes a first reflective mirror RM1 to reflect an image received thereby through the first side surface SS1 toward an exiting surface of the lens LM and a second reflective mirror RM2 to reflect an image received thereby through the second side surface SS2 toward the exiting surface of the lens LM.

The augmented reality providing device ARD6 includes an anti-reflective module RP7 disposed between the display module DD3 and the lens LM. The anti-reflective module RP7 includes a retardation film RF7 and a linear polarization film LPF7.

The linear polarization film LPF7 includes first and second polarization parts LPP7-1 and LPP7-2 respectively corresponding to (e.g., facing and parallel to) the first and second side surfaces SS1 and SS2 of the lens LM. The retardation film RF7 includes first and second retardation parts RTP7-1 and RTP7-2 respectively corresponding to (e.g., facing and parallel to) the first and second polarization parts LPP7-1 and LPP7-2.

As shown in FIG. 17, the augmented reality providing device ARD7 includes an anti-reflective module RP8 disposed between the display module DD3 and the lens LM. The anti-reflective module RP8 includes a retardation film RF8 and a linear polarization film LPF8.

The augmented reality providing device ARD7 has substantially the same structure as the augmented reality providing device ARD6 except that the anti-reflective module RP8 surrounds side surfaces SS1 to SS8 of the lens LM.

The linear polarization film LPF8 may include first, second, third, and fourth polarization parts LPP7-1, LPP7-2, LPP7-3, and LPP7-4. The first and second polarization parts LPP7-1 and LPP7-2 respectively correspond to the first and second side surfaces SS1 and SS2 of the lens LM. The third and fourth polarization parts LPP7-3 and LPP7-4 are disposed closer to the third and fourth side surfaces SS3 and SS4, respectively.

The retardation film RF8 may include first, second, third, and fourth retardation parts RTP7-1, RTP7-2, RTP7-3, and RTP7-4. The first and second retardation parts RTP7-1 and RTP7-2 respectively correspond to the first and second polarization parts LPP7-1 and LPP7-2 of the lens LM. The third and fourth retardation parts RTP7-3 and RTP7-4 are disposed closer to the third and fourth polarization parts LPP7-3 and RTP7-4, respectively.

Since the augmented reality providing device ARD7 shown in FIG. 17 includes the anti-reflective module RP8 that covers all the side surfaces of the lens LM, the external light may be more effectively prevented from being provided to the user's eye HE after being reflected by the display module DD3. Accordingly, a phenomenon by which the user views the normal image overlaid on the external light image may be prevented or substantially prevented, and as a result, the user may see a more clear image.

Figure 18:
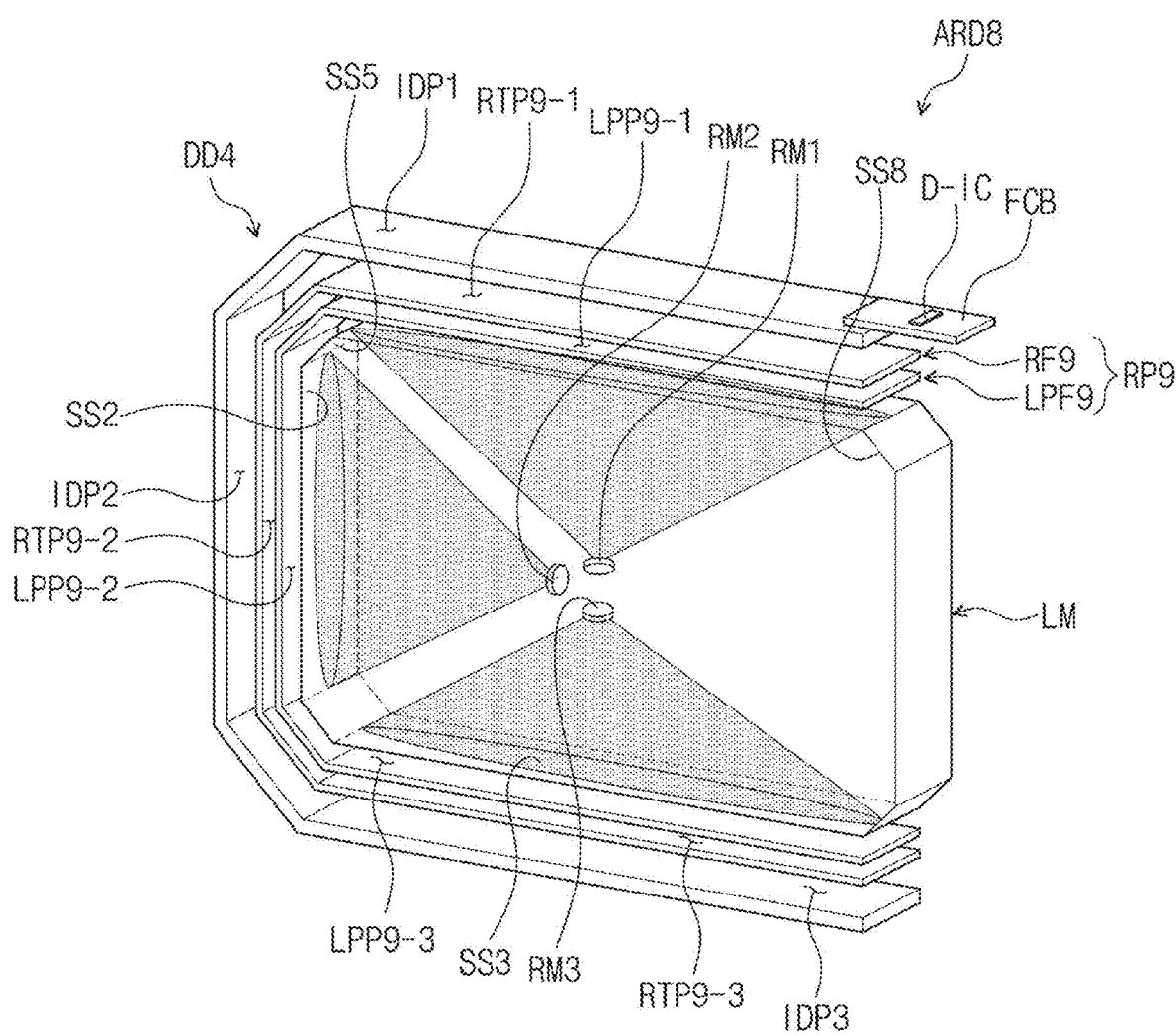
FIG. 18 is an exploded perspective view showing an augmented reality providing device according to another exemplary embodiment of the present disclosure.
Figure 19:
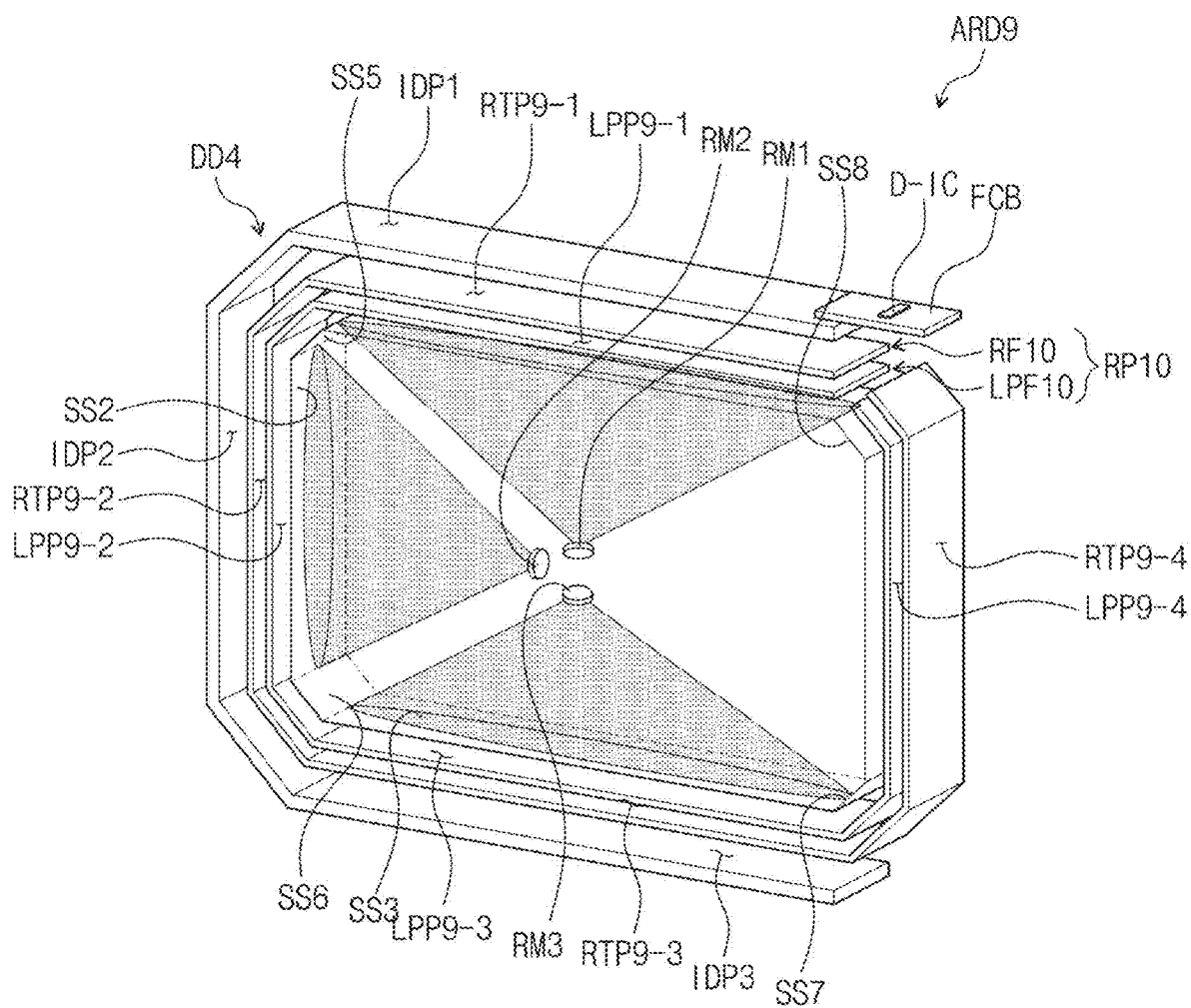
FIG. 19 is an exploded perspective view showing an augmented reality providing device according to another exemplary embodiment of the present disclosure.

FIG. 18 is an exploded perspective view showing an augmented reality providing device ARD8 according to another exemplary embodiment of the present disclosure, and FIG. 19 is an exploded perspective view showing an augmented reality providing device ARD9 according to another exemplary embodiment of the present disclosure.

Referring to FIG. 18, the augmented reality providing device ARD8 according to another exemplary embodiment of the present disclosure includes a display module DD4 including first, second, and third display parts IDP1, IDP2, and IDP3. The first display part IDP1 of the display module DD4 is disposed closer to a first side surface SS1 of the lens LM, the second display part IDP2 is disposed closer to a second side surface SS2 of the lens LM, and the third display part IDP3 is disposed by a third side surface SS3 of the lens LM. The first display part IDP1 of the display module DD4 displays a virtual image at the first side surface SS1 of the lens LM, the second display part IDP2 of the display module DD4 displays the virtual image at the second side surface SS2 of the lens LM, and the third display part IDP3 of the display module DD4 displays the virtual image at the third side surface SS3 of the lens LM.

The lens LM includes a first reflective mirror RM1, a second reflective mirror RM2, and a third reflective mirror RM3. The first reflective mirror RM1 reflects an image received thereby through the first side surface SS1 toward an exiting surface of the lens LM, and the second reflective mirror RM2 reflects an image received thereby through the second side surface SS2 toward the exiting surface of the lens LM. The third reflective mirror RM3 reflects an image received thereby through the third side surface SS3 toward the exiting surface of the lens LM.

The augmented reality providing device ARD8 includes an anti-reflective module RP9 disposed between the display module DD4 and the lens LM. The anti-reflective module RP9 includes a retardation film RF9 and a linear polarization film LPF9.

The linear polarization film LPF9 includes first, second, and third polarization parts LPP9-1, LPP9-2, and LPP9-3 respectively corresponding to (e.g., facing and parallel to) the first, second, and third side surfaces SS1, SS2, and SS3 of the lens LM. The retardation film RF9 includes first, second, and third retardation parts RTP9-1, RTP9-2, and RTP9-3 respectively corresponding to (e.g., facing and parallel to) the first, second, and third polarization parts LPP9-1, LPP9-2, and LPP9-3.

As shown in FIG. 19, the augmented reality providing device ARD9 includes an anti-reflective module RP10 disposed between the display module DD4 and the lens LM. The anti-reflective module RP10 includes a retardation film RF10 and a linear polarization film LPF10.

The augmented reality providing device ARD9 has substantially the same structure as the augmented reality providing device ARD8 except that the anti-reflective module RP10 surrounds side surfaces SS1 to SS8 of the lens LM.

In detail, the linear polarization film LPF10 may include first, second, third, and fourth polarization parts LPP9-1, LPP9-2, LPP9-3, and LPP9-4 respectively corresponding to (e.g., facing and parallel to) the first, second, third, and fourth side surfaces SS1, SS2, SS3, and SS4 of the lens LM. The retardation film RF10 may include first, second, third, and fourth retardation parts RTP9-1, RTP9-2, RTP9-3, and RTP9-4 respectively corresponding to (e.g., facing and parallel to) the first, second, third, and fourth polarization parts LPP9-1, LPP9-2, LPP9-3, and LPP9-4.

Since the augmented reality providing device ARD9 shown in FIG. 19 includes the anti-reflective module RP10 that covers all the side surfaces SS1 to SS8 of the lens LM, the external light may be more effectively prevented from being provided to the user's eye HE after being reflected by the display module DD4. Accordingly, a phenomenon by which the user views the normal image overlaid on the external light image may be prevented or substantially prevented, and as a result, the user may see a more clear image.

Figure 20:
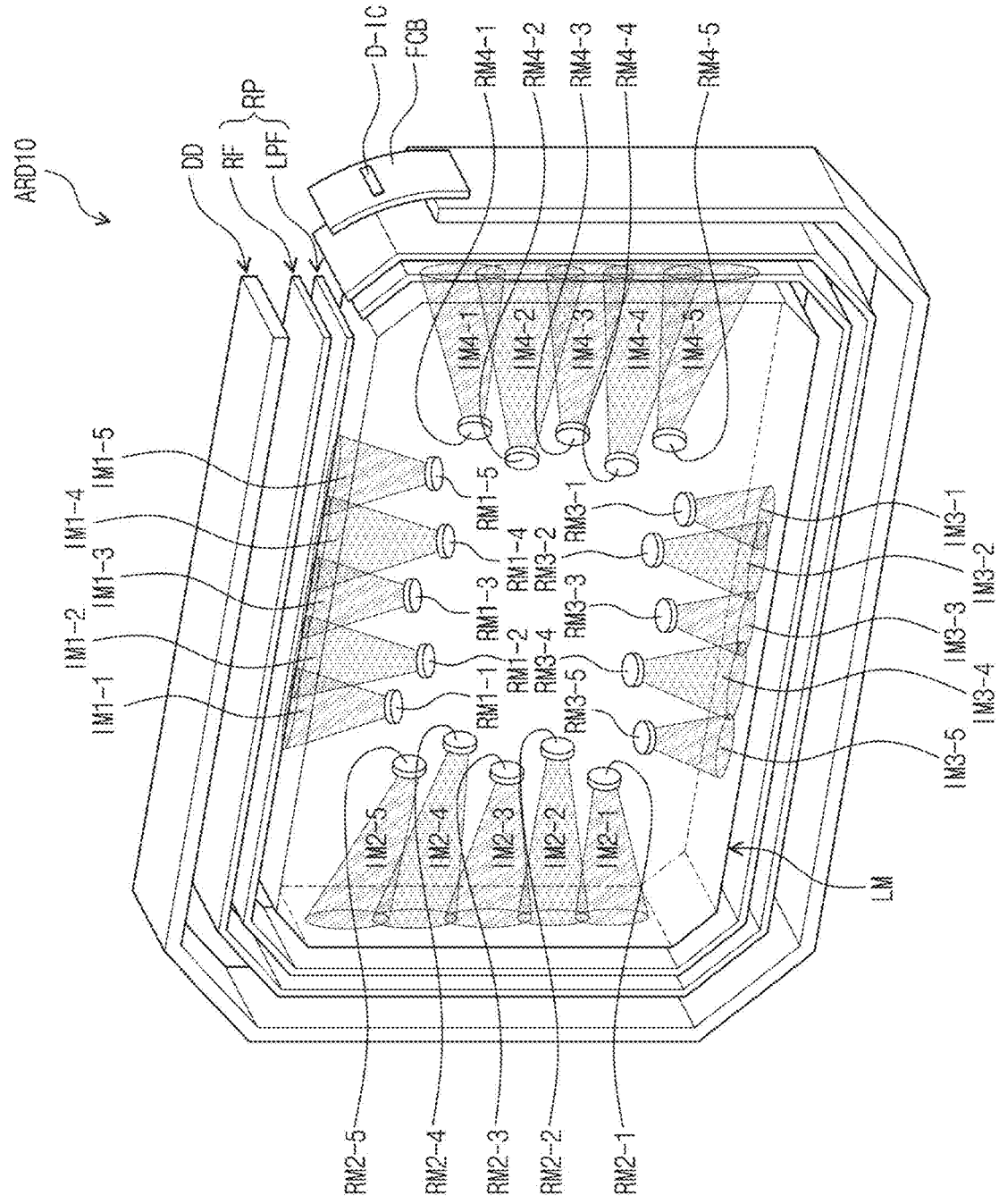
FIG. 20 is an exploded perspective view showing an augmented reality providing device according to another exemplary embodiment of the present disclosure.

FIG. 20 is an exploded perspective view showing an augmented reality providing device ARD10 according to another exemplary embodiment of the present disclosure.

In the augmented reality providing device ARD10 shown in FIG. 20, a lens LM differs from the embodiment shown in FIG. 1 in that it includes a plurality of first reflective mirrors RM1-1, RM1-2, RM1-3, RM1-4, and RM1-5, a plurality of second reflective mirrors RM2-1, RM2-2, RM2-3, RM2-4, and RM2-5, a plurality of third reflective mirrors RM3-1, RM3-2, RM3-3, RM3-4, and RM3-5, and a plurality of fourth reflective mirrors RM4-1, RM4-2, RM4-3, RM4-4, and RM4-5. In FIG. 20, descriptions on the same elements as those of the embodiment shown in FIG. 1 will be omitted.

Referring to FIG. 20, the first reflective mirrors may include first-first to first-fifth reflective mirrors RM1-1, RM1-2, RM1-3, RM1-4, and RM1-5. A first display part IDP1 of the display module DD may be divided into first-first to first-fifth display areas respectively displaying first-first to first-fifth images IM1-1, IM1-2, IM1-3, IM1-4, and IM1-5. The first-first to first-fifth reflective mirrors RM1-1 to RM1-5 reflect the first-first to first-fifth images IM1-1 to IM1-5 displayed through the first-first to first-fifth display areas toward an exiting surface of the lens LM to provide the user's eye HE with the first-first to first-fifth images IM1-1 to IM1-5.

The second reflective mirrors may include second-first to second-fifth reflective mirrors RM2-1, RM2-2, RM2-3, RM2-4, and RM2-5. A second display part IDP2 of the display module DD may be divided into second-first to second-fifth display areas respectively displaying second-first to second-fifth images IM2-1, IM2-2, IM2-3, IM2-4, and IM2-5. The second-first to second-fifth reflective mirrors RM2-1 to RM2-5 reflect the second-first to second-fifth images IM2-1 to IM2-5 displayed through the second-first to second-fifth display areas toward the exiting surface of the lens LM to provide the user's eye HE with the second-first to second-fifth images IM2-1 to IM2-5.

The third reflective mirrors may include third-first to third-fifth reflective mirrors RM3-1, RM3-2, RM3-3, RM3-4, and RM3-5. A third display part IDP3 of the display module DD may be divided into third-first to third-fifth display areas respectively displaying third-first to third-fifth images IM3-1, IM3-2, IM3-3, IM3-4, and IM3-5. The third-first to third-fifth reflective mirrors RM3-1 to RM3-5 reflect the third-first to third-fifth images IM3-1 to IM3-5 displayed through the third-first to third-fifth display areas toward the exiting surface of the lens LM to provide the user's eye HE with the third-first to third-fifth images IM3-1 to IM3-5.

The fourth reflective mirrors may include fourth-first to fourth-fifth reflective mirrors RM4-1, RM4-2, RM4-3, RM4-4, and RM4-5. A fourth display part IDP4 of the display module DD may be divided into fourth-first to fourth-fifth display areas respectively displaying fourth-first to fourth-fifth images IM4-1, IM4-2, IM4-3, IM4-4, and IM4-5. The fourth-first to fourth-fifth reflective mirrors RM4-1 to RM4-5 reflect the fourth-first to fourth-fifth images IM4-1 to IM4-5 displayed through the fourth-first to fourth-fifth display areas toward the exiting surface of the lens LM to provide the user's eye HE with the fourth-first to fourth-fifth images IM4-1 to IM4-5.

That is, the first-first to first-fifth images IM1-1 to IM1-5, the second-first to second-fifth images IM2-1 to IM2-5, the third-first to third-fifth images IM3-1 to IM3-5, and the fourth-first to fourth-fifth images IM4-1 to IM4-5 are reflected by the first-first to first-fifth reflective mirrors RM1-1 to RM1-5, the second-first to second-fifth reflective mirrors RM2-1 to RM2-5, the third-first to third-fifth reflective mirrors RM3-1 to RM3-5, and the fourth-first to fourth-fifth reflective mirrors RM4-1 to RM4-5, and thus a depth of field becomes deep.

In addition, the first-first to first-fifth reflective mirrors RM1-1 to RM1-5, the second-first to second-fifth reflective mirrors RM2-1 to RM2-5, the third-first to third-fifth reflective mirrors RM3-1 to RM3-5, and the fourth-first to fourth-fifth reflective mirrors RM4-1 to RM4-5 allow a virtual image displayed by the display module DD, for example, the first-first to first-fifth images IM1-1 to IM1-5, the second-first to second-fifth images IM2-1 to IM2-5, the third-first to third-fifth images IM3-1 to IM3-5, and the fourth-first to fourth-fifth images IM4-1 to IM4-5, to be formed at one point on the retina of the user's eye HE. Accordingly, even though the user focuses on the real image through the lens LM, the user may see the virtual image clearly. That is, although the user does not shift the focus on the real image, the user may see the virtual image clearly.

As an example of the present disclosure, some reflective mirrors among the first-first to first-fifth reflective mirrors RM1-1 to RM1-5 may be disposed closer to the first display part IDP1 than the other reflective mirrors among the first-first to first-fifth reflective mirrors RM1-1 to RM1-5. For example, the first-first reflective mirror RM1-1, the first-third reflective mirror RM1-3, and the first-fifth reflective mirror RM1-5 may be disposed closer to the first display part IDP1 than the first-second reflective mirror RM1-2 and the first-fourth reflective mirror RM1-4. In this case, an inclined angle of each of the first-first, first-third, and first-fifth reflective mirrors RM1-1, RM1-3, and RM1-5 may be greater than an inclined angle of each of the first-second and first-fourth reflective mirrors RM1-2 and RM1-4.

Similarly, some reflective mirrors among the second-first to second-fifth reflective mirrors RM2-1 to RM2-5 may be disposed closer to the second display part IDP2 than the other reflective mirrors among the second-first to second-fifth reflective mirrors RM2-1 to RM2-5. The third-first to third-fifth reflective mirrors RM3-1 to RM3-5 and the fourth-first to fourth-fifth reflective mirrors RM4-1 to RM4-5 may be disposed in a similar manner.

As described above, each of the display parts IDP1 to IDP4 may include the plural display areas, and the plural images displayed through the plural display areas may be provided to the user's eye HE by the plural reflective mirrors. According to the embodiment shown in FIG. 20, the area visible to the user's eye may be widened in each of the display parts IDP1 to IDP4 as compared with the embodiment shown in FIG. 1, so that the field of view (FOV) of the user may be widened.

The augmented reality providing device ARD10 shown in FIG. 20 includes an anti-reflective module RP as well. Since the anti-reflective module RP has substantially the same structure as that of the anti-reflective module RP shown in FIG. 1, details thereof will be omitted.

Figure 21:
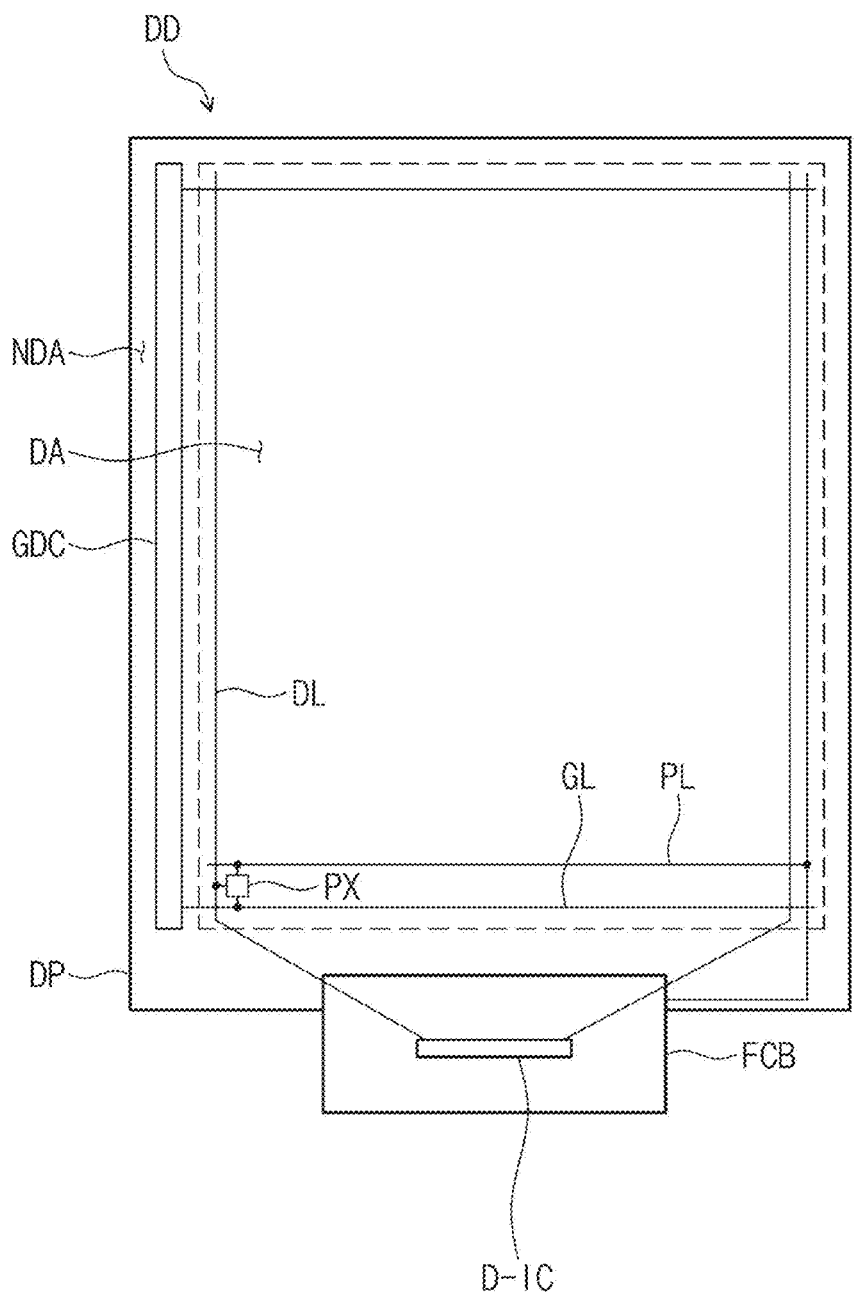
FIG. 21 is a plan view showing a display panel according to an exemplary embodiment of the present disclosure.
Figure 22:
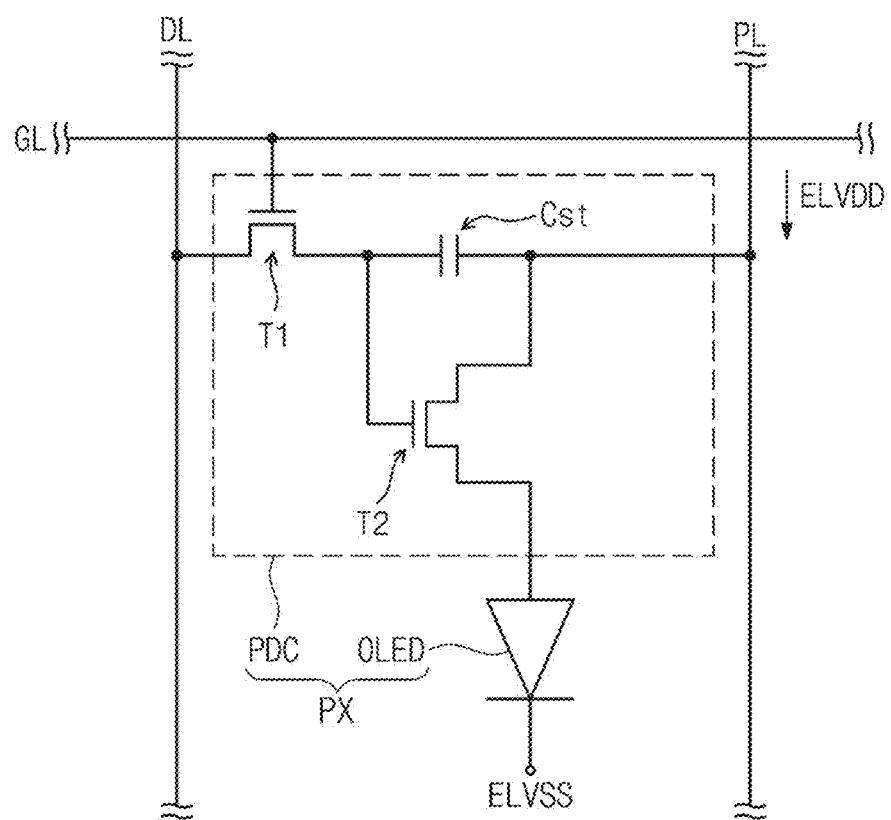
FIG. 22 is a circuit diagram showing a pixel shown in FIG. 21.
Figure 23:
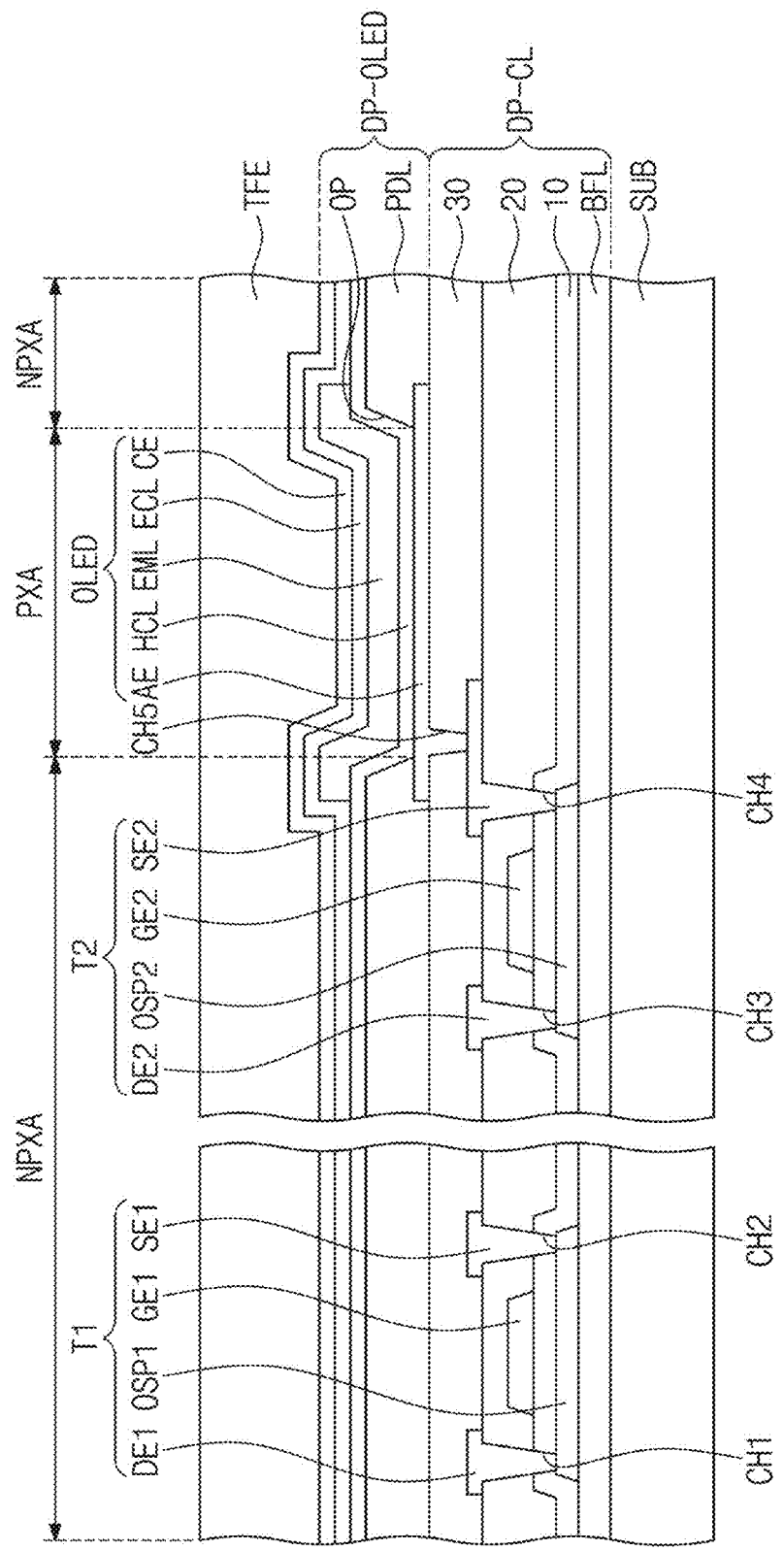
FIG. 23 is a cross-sectional view showing a display panel according to an exemplary embodiment of the present disclosure.

FIG. 21 is a plan view showing a display panel DD according to an exemplary embodiment of the present disclosure, FIG. 22 is a circuit diagram showing a pixel PX shown in FIG. 21, and FIG. 23 is a cross-sectional view showing the display panel DD according to an exemplary embodiment of the present disclosure.

Referring to FIGS. 21 to 23, the display module DD may include a display panel DP. The display panel DP includes a display area DA and a non-display area NDA when viewed in a plan view. In the present exemplary embodiment, the non-display area NDA is defined along an edge of the display area DA.

The display panel DP includes a driving circuit GDC, a plurality of signal lines GL, DL, and PL, and a plurality of pixels PX. The pixels PX are arranged in the display area DA. Each of the pixels PX includes an organic light emitting diode OLED and a pixel driving circuit PDC connected to the organic light emitting diode OLED. The driving circuit GDC, the signal lines GL, DL, and PL, and the pixel driving circuit PDC may be included in a circuit element layer DP-CL shown in FIG. 23.

The driving circuit GDC includes a shift register. The shift register includes a plurality of stages, each of which generates a plurality of scan signals, and sequentially outputs the scan signals to a plurality of scan lines GL described later. As another example, the driving circuit GDC may further output another control signal to the pixel driving circuit PDC.

The driving circuit GDC may include a plurality of thin film transistors formed through the same process as the pixel driving circuit PDC, e.g., a low temperature polycrystalline silicon (LTPS) process or a low temperature polycrystalline oxide (LTPO) process.

The signal lines GL, DL, and PL include the scan lines GL, data lines DL, and a power line PL. Each of the scan lines GL is connected to a corresponding pixel PX among the pixels PX, and each of the data lines DL is connected to a corresponding pixel PX among the pixels PX. The power line PL is connected to the pixels PX.

The display module DD includes a circuit board FCB connected to the display panel DP and a driving chip D-IC mounted on the circuit board FCB. The circuit board FCB may be a flexible circuit board.

In the present exemplary embodiment, a chip-on-film (COF) structure in which the driving chip D-IC is mounted on the circuit board FCB is shown, however, it should not be limited thereto or thereby. For example, the display module DD may have a chip-on-panel (COP) structure in which the driving chip D-IC is mounted on the display panel DP.

FIG. 22 shows the pixel PX connected to one scan line GL, one data line DL, and the power line PL as a representative example. A configuration of the pixel PX may be changed without being limited thereto or thereby.

The organic light emitting diode OLED may be a front surface light emitting type diode or a rear surface light emitting type diode. The pixel PX includes a first transistor T1 (or a "switching transistor"), a second transistor T2 (or a "driving transistor"), and a capacitor Cst as the pixel driving circuit PDC to drive the organic light emitting diode OLED. A first power voltage ELVDD is applied to the second transistor T2, and a second power voltage ELVSS is applied to the organic light emitting diode OLED. The second power voltage ELVSS may be lower than the first power voltage ELVDD.

The first transistor T1 outputs a data signal applied thereto through the data line DL in response to a scan signal applied thereto through the scan line GL. The capacitor Cst is charged with a voltage corresponding to the data signal provided from the first transistor T1.

The second transistor T2 is connected to the organic light emitting diode OLED. The second transistor T2 controls a driving current flowing through the organic light emitting diode OLED in response to an amount of electric charge charged in the capacitor Cst. The organic light emitting diode OLED emits a light during a turned-on period of the second transistor T2.

FIG. 22 shows a structure in which the pixel driving circuit PDC includes two transistors T1 and T2 and one capacitor Cst, however, the configuration of the pixel driving circuit PDC should not be limited thereto or thereby.

As shown in FIG. 23, in the display panel DP according to an exemplary embodiment of the present disclosure, the circuit element layer DP-CL, a display element layer DP-OLED, and a thin film encapsulation layer TFE may be sequentially stacked on a base layer SUB.

The circuit element layer DP-CL includes at least one inorganic layer, at least one organic layer, and a circuit element. The circuit element layer DP-CL includes a buffer layer BFL that is the inorganic layer, a first intermediate inorganic layer 10, a second intermediate inorganic layer 20, and an intermediate organic layer 30 that is the organic layer.

The inorganic layers may include silicon nitride, silicon oxynitride, silicon oxide, and/or the like. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. The circuit element includes conductive patterns and/or semiconductor patterns.

The buffer layer BFL improves a coupling force between the base layer SUB and the conductive patterns or the semiconductor patterns. A barrier layer may be further disposed on an upper surface of the base layer SUB to prevent or substantially prevent foreign substances from entering. The buffer layer BFL and the barrier layer may be selectively disposed or omitted.

A semiconductor pattern OSP1 (hereinafter, referred to as a "first semiconductor pattern") of the first transistor T1 and a semiconductor pattern OSP2 (hereinafter, referred to as a "second semiconductor pattern") of the second transistor T2 are disposed on the buffer layer BFL. The first semiconductor pattern OSP1 and the second semiconductor pattern OSP2 may be selected from amorphous silicon, polycrystalline silicon, and metal oxide semiconductor.

The first intermediate inorganic layer 10 is disposed on the first semiconductor pattern OSP1 and the second semiconductor pattern OSP2. A control electrode GE1 (hereinafter, referred to as a "first control electrode") of the first transistor T1 and a control electrode GE2 (hereinafter, referred to as a "second control electrode") of the second transistor T2 are disposed on the first intermediate inorganic layer 10. The first control electrode GE1 and the second control electrode GE2 may be formed through the same photolithography process as the scan lines GL (refer to FIGS. 21 and 22).

The second intermediate inorganic layer 20 is disposed on the first intermediate inorganic layer 10 to cover the first control electrode GE1 and the second control electrode GE2. An input electrode DE1 (hereinafter, referred to as a "first input electrode") and an output electrode SE1 (hereinafter, referred to as a "first output electrode") of the first transistor T1 and an input electrode DE2 (hereinafter, referred to as a "second input electrode") and an output electrode SE2 (hereinafter, referred to as a "second output electrode") of the second transistor T2 are disposed on the second intermediate inorganic layer 20.

The first input electrode DE1 and the first output electrode SE1 are connected to the first semiconductor pattern OSP1 respectively through a first contact hole (or a first contact opening) CH1 and a second contact hole (or a second contact opening) CH2, which are defined through the first intermediate inorganic layer 10 and the second intermediate inorganic layer 20. The second input electrode DE2 and the second output electrode SE2 are connected to the second semiconductor pattern OSP2 respectively through a third contact hole (or a third contact opening) CH3 and a fourth contact hole (or a fourth contact opening) CH4, which are defined through the first intermediate inorganic layer 10 and the second intermediate inorganic layer 20. According to another embodiment of the present disclosure, a portion of the first transistor T1 and the second transistor T2 may be changed to a bottom gate structure.

The intermediate organic layer 30 is disposed on the second intermediate inorganic layer 20 to cover the first input electrode DE1, the second input electrode DE2, the first output electrode SE1, and the second output electrode SE2. The intermediate organic layer 30 may provide a flat surface.

The display element layer DP-OLED is disposed on the intermediate organic layer 30. The display element layer DP-OLED includes a pixel definition layer PDL and the organic light emitting diode OLED. The pixel definition layer PDL includes an organic material as the intermediate organic layer 30. A first electrode AE is disposed on the intermediate organic layer 30. The first electrode AE is connected to the second output electrode SE2 through a fifth contact hole (or a fifth contact opening) CH5 defined through the intermediate organic layer 30. An opening OP is defined through the pixel definition layer PDL. At least a portion of the first electrode AE is exposed through the opening OP of the pixel definition layer PDL.

The pixel PX is disposed in a pixel area when viewed in a plan view. The pixel area includes a light emitting area PXA and a non-light emitting area NPXA disposed adjacent to the light emitting area PXA. The non-light emitting area NPXA surrounds the light emitting area PXA. In the present exemplary embodiment, the light emitting area PXA is defined to correspond to a portion of the first electrode AE exposed through the opening OP.

A hole control layer HCL may be commonly disposed over the light emitting area PXA and the non-light emitting area NPXA. A common layer like the hole control layer HCL may be commonly formed over the plural pixels PX (refer to FIG. 22).

A light emitting layer EML may be disposed on the hole control layer HCL. The light emitting layer EML may be disposed in an area corresponding to the opening OP. That is, the light emitting layer EML may be formed in each of the pixels PX after being divided into plural portions. The light emitting layer EML may include an organic material and/or an inorganic material. In the present exemplary embodiment, the light emitting layer EML is patterned, however, the light emitting layer EML may be commonly disposed over the pixels PX. In this case, the light emitting layer EML may emit a white light. In addition, the light emitting layer EML may have a multi-layer structure.

An electron control layer ECL is disposed on the light emitting layer EML. The electron control layer ECL may be commonly formed over the pixels PX (refer to FIG. 22).

A second electrode CE is disposed on the electron control layer ECL. The second electrode CE is commonly disposed over the pixels PX.

The thin film encapsulation layer TFE is disposed on the second electrode CE. The thin film encapsulation layer TFE is commonly disposed over the pixels PX. In the present exemplary embodiment, the thin film encapsulation layer TFE directly covers the second electrode CE. In an exemplary embodiment of the present disclosure, a capping layer may be further disposed between the thin film encapsulation layer TFE and the second electrode CE to cover the second electrode CE. In this case, the thin film encapsulation layer TFE may directly cover the capping layer.

FIG. 23 shows an example of the display panel DP, and the display panel DP of the present disclosure should not be limited to the structure of FIG. 23.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The augmented reality providing device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the augmented reality providing device may be formed on one integrated circuit (IC) chip or on separate IC chips. Further, the various components of the augmented reality providing device may be implemented on a flexible printed circuit film, a tape carrier package (TCP), a printed circuit board (PCB), or formed on a same substrate. Further, the various components of the augmented reality providing device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims and equivalents thereof.

What is claimed is:

1. An augmented reality providing device comprising:
a lens comprising a reflective mirror, the lens having side surfaces surrounding and crossing an exiting surface of the lens, the reflective mirror being inside of the lens and surrounded by the side surfaces of the lens;
a display module comprising at least one display part on at least one side surface of the side surfaces of the lens and configured to provide an image generated from the at least one display part toward the at least one side surface of the lens, the display module being outside of the lens and at least partially surrounding the side surfaces of the lens; and
an anti-reflective module on an other side surface, which is opposite to the at least one side surface of the lens and crosses the exiting surface, to remove a first portion of the image which is not reflected by the reflective mirror and output through the other side surface, the anti-reflective module being outside of the lens and the reflective mirror being between the display module and the anti-reflective module,
wherein a second portion of the image from the display module is reflected toward the exiting surface of the lens by the reflective mirror.

2. The augmented reality providing device of claim 1, wherein the display module comprises:
a first display part on a first side surface of the lens;
a second display part on a second side surface of the lens;
a third display part on a third side surface of the lens; and
a fourth display part on a fourth side surface of the lens.

3. The augmented reality providing device of claim 2, wherein the anti-reflective module comprises:
a retardation film on the other side surface of the side surfaces of the lens; and
a linear polarization film between the retardation film and the other side surface of the lens.

4. The augmented reality providing device of claim 3, wherein the linear polarization film comprises first, second, third, and fourth polarization parts respectively corresponding to the first, second, third, and fourth side surfaces of the lens, and
wherein the retardation film comprises first, second, third, and fourth retardation parts respectively corresponding to the first, second, third, and fourth polarization parts.

5. The augmented reality providing device of claim 4, wherein the first, second, third, and fourth polarization parts are respectively closer to the first, second, third, and fourth side surfaces of the lens more than the first, second, third, and fourth retardation parts, and
wherein the first, second, third, and fourth retardation parts are between the first, second, third, and fourth polarization parts and the first, second, third, and fourth display parts, respectively.

6. The augmented reality providing device of claim 4, wherein the first and third polarization parts face each other, the second and fourth polarization parts face each other, the first and third polarization parts have polarization axes substantially parallel to each other, and the second and fourth polarization parts have polarization axes substantially parallel to each other.

7. The augmented reality providing device of claim 6, wherein the first, second, third, and fourth polarization parts have polarization axes substantially parallel to each other.

8. The augmented reality providing device of claim 3, wherein the retardation film is a quarter wavelength ($\lambda/4$) retardation film.

9. The augmented reality providing device of claim 2, wherein the anti-reflective module comprises:
a first anti-reflective module between the first and second side surfaces of the lens and the first and second display parts; and
a second anti-reflective module between the third and fourth side surfaces of the lens and the third and fourth display parts.

10. The augmented reality providing device of claim 9, wherein the first anti-reflective module comprises:
a first linear polarization film comprising first and second polarization parts respectively corresponding to the first and second side surfaces of the lens; and a first retardation film comprising first and second retardation parts between the first and second display parts and the first and second polarization parts, respectively, and wherein the second anti-reflective module comprises:
- a second linear polarization film comprising third and fourth polarization parts respectively corresponding to the third and fourth side surfaces of the lens; and
- a second retardation film comprising third and fourth retardation parts between the third and fourth display parts and the third and fourth polarization parts, respectively.

11. The augmented reality providing device of claim 10, wherein the first and third polarization parts face each other, the second and fourth polarization parts face each other, the first and third polarization parts have polarization axes substantially perpendicular to each other, and the second and fourth polarization parts have polarization axes substantially perpendicular to each other.

12. The augmented reality providing device of claim 11, wherein the first and second polarization parts have polarization axes substantially parallel to each other, and the third and fourth polarization parts have polarization axes substantially parallel to each other.

13. The augmented reality providing device of claim 10, wherein each of the first and second retardation films is a quarter wavelength ($\lambda/4$) retardation film.

14. The augmented reality providing device of claim 2, wherein the anti-reflective module comprises:
- a first anti-reflective module between the first side surface of the lens and the first display part;
- a second anti-reflective module between the second side surface of the lens and the second display part;
- a third anti-reflective module between the third side surface of the lens and the third display part; and
- a fourth anti-reflective module between the fourth side surface of the lens and the fourth display part.

15. The augmented reality providing device of claim 14, wherein the reflective mirror comprises:
- a first reflective mirror configured to reflect a first image displayed through the first display part toward the exiting surface of the lens;
- a second reflective mirror configured to reflect a second image displayed through the second display part toward the exiting surface of the lens;
- a third reflective mirror configured to reflect a third image displayed through the third display part toward the exiting surface of the lens; and
- a fourth reflective mirror configured to reflect a fourth image displayed through the fourth display part toward the exiting surface of the lens.

16. The augmented reality providing device of claim 15, wherein each of the first, second, third, and fourth reflective mirrors comprises a plurality of reflective mirrors.

17. The augmented reality providing device of claim 1, wherein the display module is on a first side surface of the lens.

18. The augmented reality providing device of claim 17, wherein the anti-reflective module is between the display module and the first side surface.

19. The augmented reality providing device of claim 17, wherein the anti-reflective module extends to cover all side surfaces of the lens except for the first side surface of the lens.

20. The augmented reality providing device of claim 1, wherein the display module comprises an organic light emitting display device.

21. The augmented reality providing device of claim 1, wherein the display module comprises a flexible display module.

22. An augmented reality providing device comprising:
- a lens comprising a first reflective mirror and a second reflective mirror, the lens having side surfaces surrounding and crossing an exiting surface of the lens, the first and second reflective mirrors being inside the lens and surrounded by the side surfaces of the lens;
- a first display module on a first side surface of the side surfaces of the lens to provide a first image toward the first side surface of the lens, the first display module being disposed outside the lens and surrounding the first side surface;
- a second display module on a second side surface of the lens to provide a second image toward the second side surface of the lens, the second display module being disposed outside the lens and surrounding the second side surface;
- a first anti-reflective module between the second display module and the second side surface of the lens to remove a first portion of the first image which is not reflected by the first reflective mirror and reflected by the second display module after being output from the second side surface, the first and second reflective mirrors being between the first display module and the first anti-reflective module; and
- a second anti-reflective module between the first display module and the first side surface of the lens to remove a first portion of the second image which is not reflected by the second reflective mirror and reflected by the first display module after being output from the first side surface, wherein the first and second side surface are opposite to each other and cross the exiting surface of the lens, wherein the first and second anti-reflective modules are disposed outside the lens, and wherein a second portion of the first image is reflected toward the exiting surface of the lens by the first reflective mirror, and a second portion of the second image is reflected toward the exiting surface of the lens by the second reflective mirror.

23. The augmented reality providing device of claim 22, wherein the first anti-reflective module comprises:
- a first linear polarization film on the first side surface; and
- a first retardation film on the first linear polarization film, and the second anti-reflective module comprises:
- a second linear polarization film on the second side surface; and
- a second retardation film on the second linear polarization film.

24. The augmented reality providing device of claim 23, wherein a polarization axis of the first linear polarization film is substantially perpendicular to a polarization axis of the second linear polarization film.

* * * * *